United States Patent [19]
Okabe et al.

[11] Patent Number: 5,723,882
[45] Date of Patent: Mar. 3, 1998

[54] INSULATED GATE FIELD EFFECT TRANSISTOR HAVING GUARD RING REGIONS

[75] Inventors: Naoto Okabe, Chita-gun; Naohito Kato, Kariya, both of Japan

[73] Assignee: Nippondenso Co., Ltd., Kariya, Japan

[21] Appl. No.: 401,506

[22] Filed: Mar. 10, 1995

Related U.S. Application Data

[63] Continuation-in-part of Ser. No. 221,002, Apr. 1, 1994, abandoned.

[30] Foreign Application Priority Data

Mar. 10, 1994 [JP] Japan ............... 6-039874

[51] Int. Cl.⁶ .............. H01L 29/74; H01L 29/76; H01L 23/58
[52] U.S. Cl. ............... 257/139; 257/147; 257/170; 257/173; 257/368; 257/487; 257/488; 257/490
[58] Field of Search .................. 257/139, 147, 257/153, 170, 173, 487–490, 355, 368

[56] References Cited

U.S. PATENT DOCUMENTS

| | | |
|---|---|---|
| 4,041,517 | 8/1977 | Fuse et al. |
| 4,682,195 | 7/1987 | Yilmaz. |
| 4,684,967 | 8/1987 | Taylor, Sr. et al. ............... 257/394 |
| 4,803,532 | 2/1989 | Mihara. |

(List continued on next page.)

FOREIGN PATENT DOCUMENTS

| | | |
|---|---|---|
| 080044 | 6/1983 | European Pat. Off. |
| 0 156 022 | 8/1986 | European Pat. Off. |
| 0 293 846 | 12/1988 | European Pat. Off. |
| 416805 | 3/1991 | European Pat. Off. |
| 38507A1 | 10/1991 | European Pat. Off. ............... 257/139 |
| 0 501 342 A2 | 9/1992 | European Pat. Off. |
| 0 503 605 A2 | 9/1992 | European Pat. Off. |
| 402 2021 A1 | 1/1991 | Germany. |
| 64-54765 | 8/1987 | Japan. |
| 2-112285 | 10/1988 | Japan. |
| 64-81270 | 3/1989 | Japan. |
| 3-44969 | 6/1989 | Japan. |
| 4-283968 | 10/1992 | Japan. |
| 2 240 427 | 7/1991 | United Kingdom. |
| 9103842 | 3/1991 | WIPO. |

OTHER PUBLICATIONS

Laska et al, "A 2000 V Non–Punchthrough IGBT with High Ruggedness", Solid Stated Electronics, vol. 35, No. 5, pp. 681–685.

Muller et al. "Device Electronics for IC's", p. 204, 1986.

*Primary Examiner*—Tom Thomas
*Assistant Examiner*—Fetsum Abraham
*Attorney, Agent, or Firm*—Cushman, Darby & Cushman IP Group of Pillsbury, Madison & Sutro LLP

[57] ABSTRACT

An insulated gate field effect transistor comprising a semiconductor substrate having one side on which a cell area is composed of a plurality of first wells of a first conductivity type, each of the first wells containing a source region of a second conductivity type. A channel region is defined in the surface portion of the semiconductor substrate adjoining to the source region, and a gate electrode is formed, via a gate insulating film, at least over the channel region. A source electrode is in common contact with the respective source regions of the plurality of first wells. The semiconductor substrate has a drain electrode provided on another side. A current flows between the source electrode and the drain electrode through the channel being controlled by a voltage applied to the gate electrode. A guard ring area is disposed on the one side of the semiconductor substrate so as to surround the cell area. The source electrode has an extension connected to a second well of a second conductivity type formed in the one side between the cell area and the guard ring area to provide a by-pass such that, when a current concentration occurs within the guard ring area, the concentrated current is conducted directly to the source electrode in the cell area through the by-pass, thereby preventing the concentrated current from causing a forward biasing between the first wells and the source region.

19 Claims, 17 Drawing Sheets

U.S. PATENT DOCUMENTS

| | | |
|---|---|---|
| 4,972,239 | 11/1990 | Mihara . |
| 4,985,741 | 1/1991 | Bauer et al. . |
| 4,985,743 | 1/1991 | Tokura . |
| 4,994,871 | 2/1991 | Chang et al. . |
| 5,043,779 | 8/1991 | Nishimura . |
| 5,095,343 | 3/1992 | Klodzinski et al. . |
| 5,169,793 | 12/1992 | Okabe et al. . |
| 5,429,964 | 7/1995 | Yilmaz et al. ............................ 437/41 |
| 5,464,992 | 11/1995 | Okabe et al. . |
| 5,510,634 | 4/1996 | Okabe et al. ............................ 257/491 |
| 5,519,245 | 5/1996 | Tokura et al. ............................ 257/263 |

INSULATED GATE FIELD EFFECT TRANSISTOR HAVING GUARD RING REGIONS

CROSS-REFERENCE TO THE RELATED APPLICATIONS

This application is a continuation-in-part application of U.S. Ser. No. 08/221,002 filed on Apr. 1, 1994, now abandoned.

BACKGROUND OF THE INVENTION

1. Field of the Invention

The present invention relates to an insulated gate bipolar transistor (hereinafter referred to as "IGBT") integrating an anti-excess voltage protecting function and a drain voltage fixing function.

The present invention also relates to an insulated gate field effect transistor advantageously applicable as a high proof voltage and high current power switching element such as an inverter for starting a motor, a power supply, an igniter, etc.

2. Description of the Related Art

Upon turning OFF a power switching element employed as an inverting device for a motor circuit or non-interruption power source circuit, a high voltage can be induced on an inductive load or a floating inductance in the circuit due to an abrupt variation of circuit current flowing through the circuit. This high voltage is applied to the power switching element as a spike voltage to cause fatigue or breakage of the power switching element. To protect the power switching element from excess voltage, a voltage clamp circuit including a constant voltage diode based on the operation principle of avalanche breakdown for turning ON the constant voltage diode before breakdown occurs in the power switching element because of applied spike voltage. Thus, the level of the spike voltage is fixed within a safe operation range.

When an IGBT is employed as the power switching element, a similar means can be applied. Namely, the constant voltage diode is externally connected between the drain and gate of the IGBT element. However, this increases both the assembly cost and the overall circuit dimension. It is also possible that a layer of polycrystalline silicon is deposited on a substrate, in which an IGBT element has been formed, and a constant voltage diode is then formed in this polycrystalline silicon layer integrally with the IGBT element. This increases the number of photo-masks necessary in the element fabrication process leading to an increase in the production cost. Furthermore, in order to form the constant voltage diode on the surface of the IGBT element, it is necessary either to reduce the area for a cell region or to increase the chip dimension.

As a solution to this problem, Japanese Unexamined Patent Publication (Kokai) No. 64-81270 proposes a method of integrating a constant voltage diode, in which method the constant voltage diode operating based on the principle of avalanche breakdown is incorporated in the IGBT element so that the constant voltage diode is interposed between the drain and the source on an equivalent circuit. This solves the problems such as the reduction of the chip area of the IGBT element.

The proposed method provides a construction as shown in FIG. 1, including a source electrode 51, a drain electrode 52 and a gate electrode 53. The upper portion of the construction is composed of an insulating gate having a DSA (diffused self-aligned) structure, a p+ base layer 55, and an n+ source layer 56, thereby forming a p-type channel immediately below the gate. It can also be seen that the construction has a vertical npnp-lamination of four layers, i.e., the n+ source layer 56, the p+ base layer 55, an n− drain layer 57, and a p+ drain layer 54 located between an n+ layer 58 and the drain electrode 52.

The p+ drain layer 54, on the side of the drain electrode 52, is divided into small segments forming a honeycomb-like array, to provide a structure in which a vertical pnp transistor having the collector and the emitter between which a p-n junction diode is connected in parallel. The diode has a portion 59 of the n+ layer that protrudes into the n− layer 57 to be close to the p+ layer 55, to provide avalanche type constant voltage diode characteristics, thereby protecting the IGBT element from excess voltage.

To incorporate the constant voltage diode, the proposed construction must have an n+ layer 58 on the drain side thereof. The presence of the n+ layer 58 suppresses hole injection from the drain side upon conducting the IGBT element and thereby causes the ON voltage to be increased.

Moreover, the construction is complicated because of the honeycomb structure of the p+ layer 54 on the side of the drain electrode 52 and because of the portion 59 of the n+ layer 58 that protrudes into the n− drain layer 57. This raises both the wafer and production costs.

In the second phase, an insulated gate field effect transistor has a MOS structure and is driven by voltage, so that it operates using a lower power than a bipolar transistor and does not easily cause thermal runaway. It includes a power MOSFET (DMOS), which is a unipolar device, and an IGBT, which is a bipolar device. The IGBT has a structure similar to that of the power MOSFET, except that the former has a pn junction in a drain region to cause conductivity modulation in the high resistivity drain layer during operation thereby simultaneously providing both a high proof voltage and a low ON-resistance that are not attainable by a power MOSFET.

For example, FIG. 6 is a sectional view showing part of an IGBT having a cell area surrounded by a guard ring area for ensuring a high proof voltage. This structure is fabricated by the following process.

A semiconductor substrate consists of a p+ layer 101 (first semiconductor layer). A high resistivity n− layer 102 (second semiconductor layer) is formed on the p+ layer 101 by chemical vapor deposition process. Then, p layers 103, 104, and 105 (third, fourth, and fifth semiconductor layers) are simultaneously formed to a depth of 3 to 6 μm by selective diffusion. The p layer 109 and n+ layer 106 (fourth semiconductor layer) are then formed by selective diffusion. This process includes oxidization of the surface of the n− layer 102 to form a gate oxide or insulating film 107, on which a gate electrode 108 is then formed and utilized as a mask in a DSA process to form the p layer 109 and the n+ layer (source region) 106 in a self-aligned manner to provide a channel. Thereafter, an interlaminar insulating layer 110 is formed and then, to provide ohmic contacts to the p layer 103, the n+ layer 106, and the p layer 104, contact holes are opened through the upper oxide layer. A several μm thick aluminum layer is then deposited and selectively etched to form a source electrode 111, a gate electrode lead line 115, and a source electrode lead line 111a. On the reverse side of the p+ layer 101, a metal layer is deposited to provide a drain electrode 112.

FIG. 7 is a plan view of a device having the cross-sectional structure shown in FIG. 6. In FIG. 7, the source electrodes 111 are shown as grooved stripes 122 which, together with p wells consisting of the p regions 103 and 109 (hereinafter collectively referred to as "p well 103/109" or "p region. 103/109"), are repeated at a selected interval to compose a cell area A, such that the cell area A has the source electrodes 111 on the top surface. The cell area A has the periphery surrounded by the p region 4, on which the source electrode lead line 111a, the gate electrode lead line 115, a source electrode pad 130, and a gate electrode pad 131 are formed. As shown in FIG. 6, the source electrode lead line 111a and the gate electrode lead line 115 have respective contact holes 121 and 125 extending through insulating layers. The source electrode lead line 111a fixes the potential over the whole device and ensures uniform potential upon operation.

One or more guard rings 105 surround the p region 104 with a selected space therebetween. The guard rings 105 compose a guard ring area surrounded by a channel stopper region 113 to suppress propagation of, and avoid influence by, any depletion layer occurring when the substrate periphery is subjected to a high voltage. An equipotential ring 116 imparts a uniform potential to the channel stopper region 113 entirely.

In the above construction, when a voltage is applied to the gate electrode 108, a channel is formed to provide a current path between the drain electrode 112 and the source electrode 111.

In contrast to this normal operation, a surge voltage greater than the normal operating voltage is occasionally applied across the drain electrode 112 and the source electrode 111. Under such a condition, the pn junction composed of the p well 103/109 and the n– layer 102 is reverse-biassed, so that a depletion layer propagates in the high resistivity n– layer 102. In the area A of FIG. 7, the depletion layer propagates to the neighboring p wells 103/109 and the intervening n– layer 102 to cause mutual overlap thereby relaxing the working electric field. A maximum electric field $E_A$ thus occurs at the pn junction at the bottom of the p well 103/109.

On the other hand, the p layer 104 is located outside of the periphery of the p well 103/109. In the area B extending from the outer end of the p layer 104 to the free end of the n– layer 102, the above relaxation of the electric field does not occur, so that a maximum electric field $E_B$ occurs along the periphery of the p layer 104 or in the vicinity thereof at the surface of the n– layer 102.

It is generally true that $E_A > E_B$. To improve the proof voltage of the area B, or of the device, by decreasing the $E_B$ value close to the $E_A$ value, the guard rings 105 are repeatedly arranged to decrease the maximum field $E_B$ of the area B.

When a surge voltage is applied to the drain electrode 112, the electric field $E_G$ in the guard ring area is raised, so that a large number of electron-hole pairs are generated in the area outside of an outermost guard ring of the guard ring area due to impact ionization. Under this condition, the electric field $E_G$ in the guard ring area is greater in a curved portion of the guard ring area than in a linear portion, when seen on a plan view. Among the generated carriers, the holes flow out to the source electrode 111 or the source electrode lead line 111a and the electrons flow to the p+ layer or substrate 101, into which another holes are newly introduced. This phenomenon includes occurrence of currents flowing along the paths shown by the arrows in FIG. 6. A current along path "a" is conducted through the thin source lead line 111a along the p layer 104 to the source electrode pad 130, which includes a relatively high resistivity to the current, so that the current "a" is less in amount than the current "b" which flows directly to the source electrode 111. This results in greater current concentration in the cell area A near the curved portion of the guard ring area than in the cell area A along the linear portion of the the guard ring.

Consequently, a high current "b" flows through the p layer 109 in the cell area A near the curved portion of the guard ring to cause a voltage reduction leading to a forward-biassing at the pn junction between the n+ layer 106 and the p layer 109, which activates a parasitic transistor to cause breakdown due to current concentration.

To improve the antibreakdown endurance, the guard ring area must have an improved proof voltage. To provide an improved proof voltage of the guard ring area, the guard rings or diffused regions must be increased in depth and/or number. However, when a diffused region is formed to an increased depth, the obtained diffused region is also increased in width and consequently, the guard ring area occupies an increased area in the device. Moreover, the diffusion regions of the guard ring are usually formed simultaneously with the diffusion regions in the cell area in order to reduce the number of the necessary photolithographic masks, so that an increase in the width of the former is associated with an increase in the width of the latter resulting in a further increase in the area of the device chip. On the other hand, an increase in the number of the diffused regions of the guard ring area also requires an increased area occupied by the guard ring area, leading to an increase in the chip area.

The same problem occurs in MOSFETs in that, although an n-type semiconductor substrate 101 does not inject the minority carriers (or holes in this case) into a transistor formed therein, an unusually high electric field developed in the guard ring area generates a flow of impact-ionized carriers which forms a large current flowing through the p layer 109 near the curved portion of the guard ring area, and the resulting voltage reduction causes forward-biassing of the pn junction between the n+ layer 106 and the p layer 109, which activates a parasitic transistor to cause breakdown due to current concentration.

SUMMARY OF THE INVENTION

In view of the conventional problems described above, an object of the present invention is to provide an IGBT element that incorporates anti-excess voltage protecting and drain voltage-fixing function together with a function to clamp a drain-source voltage in a monolithic structure without a drawback of increasing the ON voltage.

To achieve this object, by not incorporating a constant voltage diode in an IGBT element as conventionally employed, the present inventors propose a structure such that conduction between drain and source electrodes is effected by a breakdown induced in a triple layer structure composed of a base layer of the IGBT element, a drain layer of low impurity concentration and a drain layer of high impurity concentration under a condition for desirable clamping of the drain-source voltage.

Specifically, the present invention provides an insulated gate bipolar transistor, comprising:

a first semiconductor layer of a first conductivity type;

a second semiconductor layer of a second conductivity type adjoining the first semiconductor layer;

a third semiconductor layer of the first conductivity type formed in the second semiconductor layer, with a junction between the second semiconductor layer and the third semiconductor layer terminating at a surface of the second semiconductor layer;

a fourth semiconductor layer of the second conductivity type formed in the third semiconductor layer, with a junction between the third semiconductor layer and the fourth semiconductor layer terminating at a surface of the third semiconductor layer;

a fifth semiconductor layer of the first conductivity type formed in the second semiconductor layer to enclose a region in which the third semiconductor layer is formed, with a junction between the second semiconductor layer and the fifth semiconductor layer terminating at a surface of the second semiconductor layer;

a gate electrode formed, via a gate insulating film, at least over a channel region provided by a surface of the third semiconductor layer in a portion between the second semiconductor layer and the fourth semiconductor layer;

a source electrode in contact with both of the third semiconductor layer and the fourth semiconductor layer; and a drain electrode for supplying a drain current though the first semiconductor layer;

the second semiconductor layer of the second conductivity type having an impurity concentration and a layer thickness such that, when a voltage is applied across the drain electrode and the source electrode to propagate a depletion zone from a p-n junction surface between the third semiconductor layer of the first conductivity type and the second semiconductor layer of the second conductivity type toward inside of the second semiconductor layer, a critical electric field is established that causes generation of a great number of electron-hole pairs due to impact ionization of carriers in or near the second semiconductor layer of the second conductivity type, thereby causing conduction between the drain electrode and the source electrode, at an applied voltage lower than a drain-source voltage at which the depletion region reaches the first semiconductor layer through the second semiconductor layer, the applied voltage being equal to or lower than a critical voltage that causes generation of a great number of electron-hole pairs due to impact ionization of carriers in or near the second semiconductor layer of the second conductivity type below a p-n junction between the fifth semiconductor layer of the first conductivity type and the second semiconductor layer of the second conductivity type.

Preferably, the insulated gate bipolar transistor according to the present invention further comprises a sixth semiconductor layer of the second conductivity type which is disposed at or near a p-n junction between the first semiconductor layer and the second semiconductor layer, has an impurity concentration higher than that of the second semiconductor layer, and is patterned so as to leave a contact surface between the first semiconductor layer and the second semiconductor layer for transferring carriers therethrough.

Another object of the present invention is to solve the above-mentioned conventional problems, and specifically to provide an insulated gate field effect transistor having an improved antibreakdown endurance of devices against an unusually increased electric field intensity in the guard ring area due to a surge voltage, with no increase in the chip area or size.

To achieve the object according to the present invention, there is provided an insulated gate field effect transistor comprising a semiconductor substrate having one side on which a cell area is composed of a plurality of first wells of a first conductivity type, each of the first wells containing a source region of a second conductivity type, a channel region is defined in the surface portion of the semiconductor substrate adjoining to the source region, a gate electrode is formed, via a gate insulating film, at least over the channel region, a source electrode is in common contact with the respective source regions of the plurality of first wells; the semiconductor substrate having the other side on which a drain electrode is provided; and a current flowing between the source electrode and the drain electrode through the channel being controlled by a voltage applied to the gate electrode; wherein:

a guard ring area is disposed on the one side of the semiconductor substrate so as to surround the cell area; and the source electrode has an extension connected to a second well of a first conductivity type formed in the one side between the cell area and the guard ring area to provide a bypass such that, when a current concentration occurs within the guard ring area, the concentrated current is conducted directly to the source electrode in the cell area through the by-pass, thereby preventing the concentrated current from causing a forward biassing between the first wells and the source region.

Preferably, the source electrode includes a cell portion connected to the source region in the first well and a pad portion connected to an external lead electrode, and the by-pass includes the extension of the cell portion of the source electrode.

According to the present invention, there is also provided an insulated gate field effect transistor comprising:

a first semiconductor layer;

a second semiconductor layer of a first conductivity type in contact with the first semiconductor layer;

a third semiconductor layer of a second conductivity type formed in the second semiconductor layer, with a junction between the second semiconductor layer and the third semiconductor layer terminating at a surface of the second semiconductor layer;

a fourth semiconductor layer of the first conductivity type formed in the third semiconductor layer, with a junction between the third semiconductor layer and the fourth semiconductor layer terminating at a surface of the third semiconductor layer;

a gate electrode formed, via a gate insulating film, at least over a channel region provided by a surface of the third semiconductor layer in a portion between the second semiconductor layer and the fourth semiconductor layer;

a source electrode in contact with both the third semiconductor layer and the fourth semiconductor layer;

a drain electrode for supplying a drain current through the first semiconductor layer; and a plurality of the third semiconductor layers compose a cell area in which the gate electrode is commonly connected to the plurality of the third semiconductor layers; wherein:

a guard ring area is formed between the cell area and a periphery of the second semiconductor layer to provide a band pattern surrounding the cell area; and the source electrode has an extension connected to a fifth semiconductor layer of the second conductivity type formed between the cell area and the guard ring area to provide a by-pass such that, when a current concentration occurs within the guard ring area, the concentrated current is conducted directly to the source electrode in the cell area through the by-pass, thereby preventing the concentrated current from causing a forward biassing between the first wells and the source region.

Preferably, the source electrode includes a cell portion connected to the source region in the third semiconductor layer and a pad portion connected to an external lead electrode, and the by-pass includes the extension of the cell portion of the source electrode.

According to the present invention, there is also provided an insulated gate field effect transistor comprising:

a first semiconductor layer;

a second semiconductor layer of a first conductivity type in contact with the first semiconductor layer;

a third semiconductor layer of a second conductivity type formed in the second semiconductor layer, with a junction between the second semiconductor layer and the third semiconductor layer terminating at a surface of the second semiconductor layer;

a fourth semiconductor layer of the first conductivity type formed in the third semiconductor layer, with a junction between the third semiconductor layer and the fourth semiconductor layer terminating at a surface of the third semiconductor layer;

a gate electrode formed, via a gate insulating film, at least over a channel region provided by a surface of the third semiconductor layer in a portion between the second semiconductor layer and the fourth semiconductor layer;

a source electrode in contact with both the third semiconductor layer and the fourth semiconductor layer;

a drain electrode for supplying a drain current through the first semiconductor layer; and a plurality of the third semiconductor layers compose a cell area in which the gate electrode is commonly connected to the plurality of the third semiconductor layers; wherein:

a guard ring area is formed between the cell area and a periphery of the second semiconductor layer to provide a band pattern surrounding the cell area;

a fifth semiconductor layer is formed in a surface of the second semiconductor layer in a portion between the cell area and a curved portion of the guard ring area; and the source electrode has an extension lying outside the cell area and connected to the fifth semiconductor layer.

The cell area may comprise cells in the form of a stripe or polygon.

The curved portion of the guard ring area may comprise either a smooth curve or one or more angular edges.

In one embodiment, the fifth semiconductor layer is formed outside and surrounding the cell area and both a gate electrode lead line and a source electrode lead line are formed on the fifth semiconductor layer. In another embodiment, either a source electrode lead line or a gate electrode lead line is formed on the fifth semiconductor layer.

Preferably, in the vicinity of the curved portion of the guard ring area, a contact between the gate electrode of the cell area and the gate electrode lead line formed on the fifth semiconductor layer and a contact between the extension of the source electrode and the fifth semiconductor layer are alternately disposed.

Preferably, along the entire periphery of the cell area, a contact between the gate electrode of the cell area and the gate electrode lead line formed on the fifth semiconductor layer and a contact between the extension of the source electrode and the fifth semiconductor layer are alternately disposed.

Preferably, inside the curved portion of the guard ring, between the fifth semiconductor layer and the cell area, a sixth semiconductor layer of the second conductivity type is provided and connected to the source electrode of the cell area.

According to the present invention, there is further provided an insulated gate field effect transistor comprising:

a first semiconductor layer;

a second semiconductor layer of a first conductivity type in contact with the first semiconductor layer;

a third semiconductor layer of a second conductivity type formed in the second semiconductor layer, with a junction between the second semiconductor layer and the third semiconductor layer terminating at a surface of the second semiconductor layer;

a fourth semiconductor layer of the first conductivity type formed in the third semiconductor layer, with a junction between the third semiconductor layer and the fourth semiconductor layer terminating at a surface of the third semiconductor layer;

a gate electrode formed, via a gate insulating film, at least over a channel region provided by a surface of the third semiconductor layer in a portion between the second semiconductor layer and the fourth semiconductor layer;

a source electrode in contact with both the third semiconductor layer and the fourth semiconductor layer;

a drain electrode for supplying a drain current through the first semiconductor layer; and a plurality of the third semiconductor layers compose a cell area in which the gate electrode is commonly connected to the plurality of the third semiconductor layers; wherein:

a guard ring area is formed between the cell area and a periphery of the second semiconductor layer to provide a band pattern surrounding the cell area; and a dummy layer composed of the third semiconductor layer in which the fourth semiconductor layer is not formed in the vicinity of a curved portion of the guard ring area.

DESCRIPTION OF THE PREFERRED EMBODIMENTS

Figure 1:
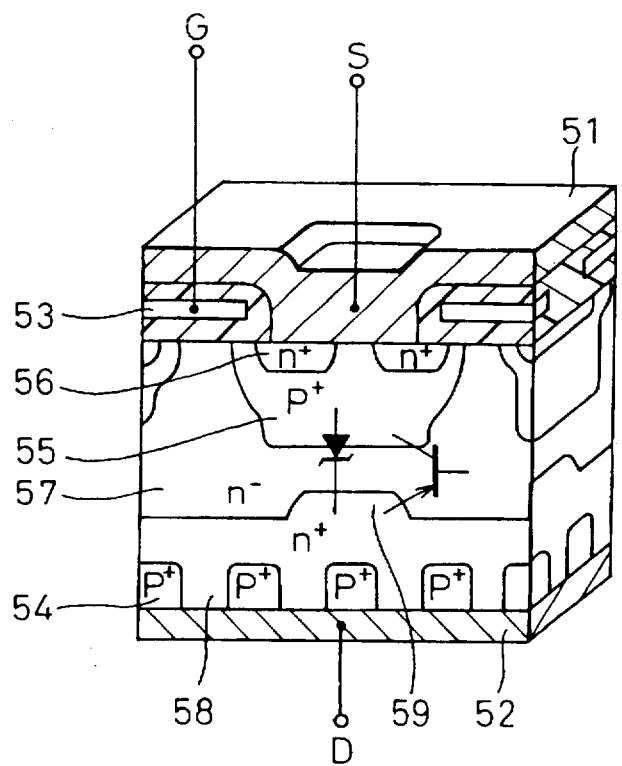
FIG. 1 shows a conventional IGBT integrating therein a constant voltage diode operating based on the principle of avalanche breakdown, in a perspective view of a partial section.

The operation of the IGBT according to the present invention will be described, particularly with respect to an embodiment having an n– channel IGBT.

When a positive voltage is applied to a drain electrode relative to a source electrode, a p-n junction defined between an n-type second semiconductor layer and a p-type third semiconductor layer is brought into a reverse biased condition, so that a depletion region propagates from this p-n junction. When the n-type second semiconductor layer has a lower impurity concentration in comparison with the p-type third semiconductor layer, the depletion region propagates through the n-type second semiconductor layer toward the p-type first semiconductor layer, as the applied voltage between the source and drain electrodes increases. The electrical field in the depletion region also increases with the increase in the source-drain voltage.

When the electrical field reaches a critical value which causes generation of a great number of electron-hole pairs in the depletion region by impact ionization, the thus-generated holes flow through the p-type third semiconductor layer to the source electrode while the generated electrons flow toward a p-n junction defined between the p-type first semiconductor layer and the n-type second semiconductor layer. This reduces a potential barrier formed by a diffusion potential at this p-n junction, so that holes or a minority carrier from the p-type first semiconductor layer are injected into the n-type second semiconductor layer, pass through the depletion region and the p-type third semiconductor layer, and flow to the source electrode. When passing through the depletion region, the holes are accelerated by the electrical field in the depletion region to obtain a large kinetic energy, thereby further generating new electron-hole pairs due to impact ionization.

With the mechanism as described above, a current abruptly begins to flow between the source electrode and the drain electrode to suppress an increase in the voltage between the source electrode and the drain electrode. This is known as a breakdown phenomenon in the bipolar transistor that occurs because the maximum electrical field, established near the base-collector p-n junction when the base electrode is open, reaches a critical electrical field. The present invention applies this phenomenon to the IGBT.

The voltage $V_{BDS}$ between the source electrode and the drain electrode, at which the current abruptly begins to flow, is an applied voltage at which the electrical field in the IGBT element reaches a critical electrical field that causes the breakdown phenomenon. It has been found that the $V_{BDS}$ value depends on the impurity concentration $N_{DND}$ of the n-type second semiconductor layer and that the smaller the $N_{DND}$, the greater the $V_{BDS}$. Therefore, the voltage $V_{BDS}$ can be set to desired values by selecting the $N_{DND}$ value of the second semiconductor layer. Namely, the IGBT element is protected from excess voltage by setting the impurity concentration of the n-type second semiconductor layer to a selected value such as to provide a $V_{BDS}$ value falling within a safe operation range of the element. This is the primary feature of the present invention.

Because of the accompanying rapid increase in the drain current, the source-drain voltage is fixed at or around a particular voltage. Thus, the IGBT structure according to the present invention internally incorporates the function for preventing the source-drain voltage from rising across a given value while fixing the source-drain voltage within a particular range.

Preferably, the IGBT element according to the present invention further comprises, as the secondary feature, an n-type sixth semiconductor layer which is disposed at or near a p-n junction between the p-type first semiconductor layer and the n-type second semiconductor layer, has an impurity concentration higher than that of the second semiconductor layer, and is patterned so as to leave a contact surface between the first semiconductor layer and the second semiconductor layer for transferring carriers therethrough. This feature advantageously restricts injection of the minority carrier (hole) from the p-type first semiconductor layer into the n-type second semiconductor layer through the p-n junction therebetween when a large number of electron-hole pairs are generated, thereby restricting the formation of a conductivity modulated region and the reduction of resistance due to the injection of the hole. As a result, at the rising of the drain current, fluctuation of drain voltage because of conductivity modulation caused by an injection of a minority carrier can be suppressed to stabilize the drain voltage when the current begins to flow through the element.

Thus, the present invention uses the operation principle that the second semiconductor layer has an impurity concentration set at a selected value to induce a breakdown in a vertically laminated triple layer structure composed of third, second and first semiconductor layers in an IGBT element under a condition for desirable clamping of the drain-source voltage. This makes it unnecessary to incorporate a constant voltage diode in an IGBT element, in contrast with the conventional IGBT structure. Therefore, the present invention is advantageous over the conventional art in that the IGBT element incorporates an anti-excess voltage protecting and drain voltage fixing function together with a drain-source voltage clamping function in a monolithic structure, without causing an increase in the ON voltage.

The present invention will now be described in more detail by way of examples for an n-channel IGBT employing p- and n-types as the first and second conductivity types, respectively.

EXAMPLE 1

Figure 2:
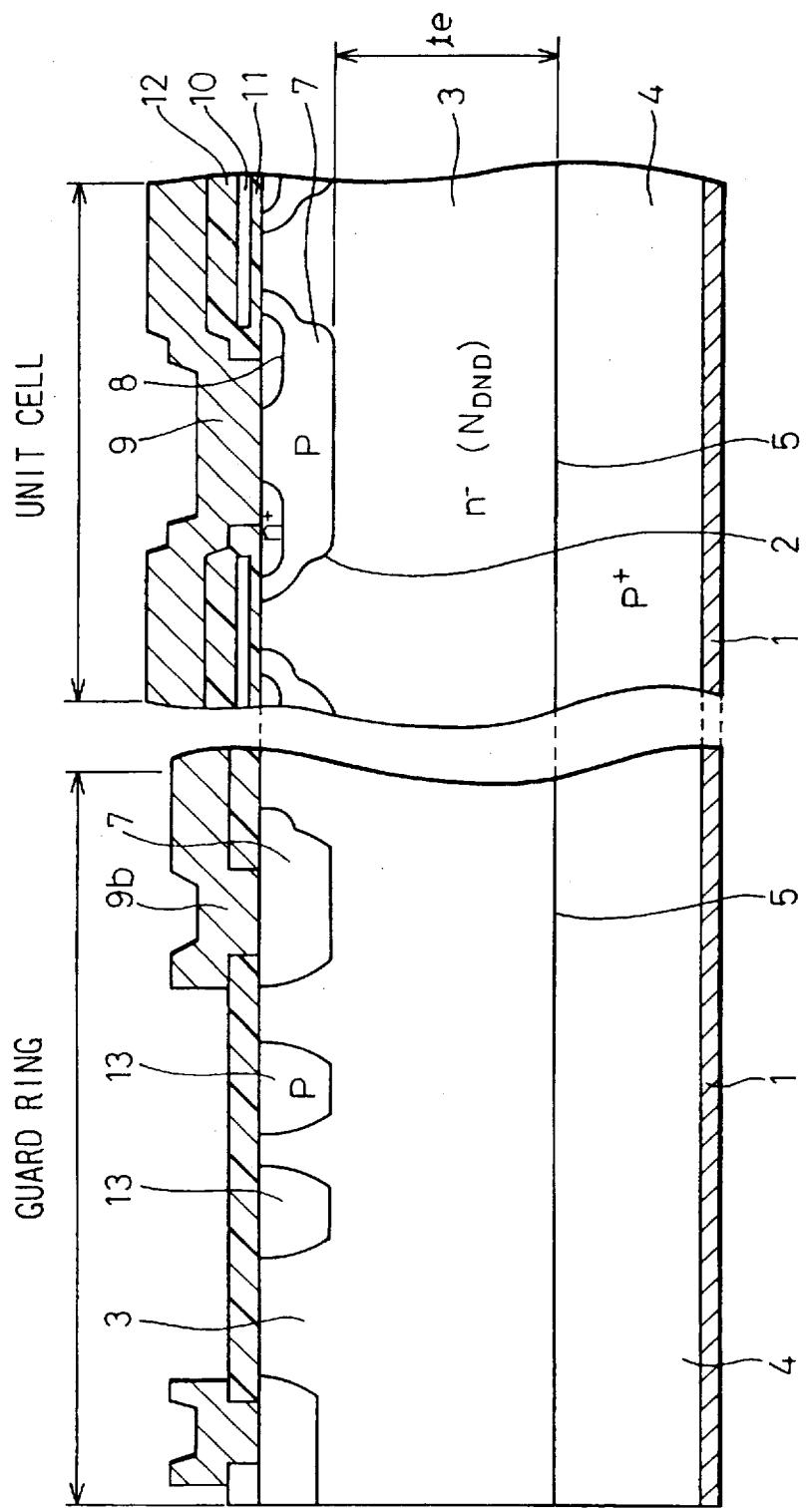
FIG. 2 shows a unit cell portion and a circumferential guard ring portion of an IGBT according to a preferred embodiment of the present invention, in a sectional view.

FIG. 2 shows a unit cell portion and a circumferential guard ring portion of an IGBT according to the first embodiment of the present invention, the guard ring enclosing the unit cell. The IGBT is fabricated in the following process.

First, a semiconductor substrate or a p+ drain layer 4 (first semiconductor layer) is prepared. A high resistivity n– drain layer 3 (second semiconductor layer) with a selected impurity concentration $N_{DND}$ and layer thickness $t_e$ is then formed by vapor deposition or other vapor phase growth process. A p base layer 7 (third semiconductor layer) and a p layer 13 (fifth semiconductor layer) are simultaneously formed to a depth of 3 to 6 μm by selective diffusion process. The p layer 13 is a guard ring to provide high breakdown voltage. An n+ source layer (fourth semiconductor layer) is formed in the p base layer 7 by selective diffusion process. It should be noted that, during the above-mentioned forming process, the n– drain layer 3 is oxidized in the surface portion to form a gate oxide film 11, on which a gate electrode 10 is then formed and is used as a mask for forming the p base layer 7 and an n+ source layer 8 in a self-aligning manner by DAS (Diffusion Self-Alignment) process to provide a channel region. Thereafter, an interlayer insulation layer 12 is formed. Subsequently, to provide an ohmic contact in the p base layer 7 and the n+ source layer 8, contact holes are opened through the gate oxide layer 11 and the interlayer insulation layer 12. Deposition of several μm of aluminum and selective etching are then performed to form a source electrode 9 and a not-shown gate electrode pad. Then, a metal film is deposited on the reverse side of the semiconductor substrate or p+ drain layer 4 to form a drain electrode 1.

The n– drain layer 3 has an impurity concentration $N_{DND}$ and a layer thickness $t_e$ such that breakdown occurs in the triple layer structure composed of the p base layer 7, the n– drain layer 3 and the p+ drain layer 4 at a voltage equal to or smaller than a source-drain proof voltage $V_{GR}$ determined by the structure of the circumferential guard ring.

Specifically, the n– layer 3 (second semiconductor layer of the second conductivity type) has an impurity concentration and a layer thickness such that, when a voltage is applied across the drain electrode 1 and the source electrode 9 to propagate a depletion zone from the surface of a p-n junction 2 between the p base layer 7 (third semiconductor layer of the first conductivity type) and the n– layer 3 (second semiconductor layer) toward inside of the n– layer 3 (second semiconductor layer), a critical electric field is established that causes generation of a great number of electron-hole pairs due to impact ionization of carriers in or near the n– layer 3 (second semiconductor layer), thereby causing conduction between the drain electrode 1 and the source electrode 9, at an applied voltage lower than a drain-source voltage at which the depletion region reaches the p+ drain layer (first semiconductor layer of the first conductivity type) through the n– layer 3 (second semiconductor layer), the applied voltage being equal to or lower than a critical voltage that causes generation of a great number of electron-hole pairs due to impact ionization of carriers in or near the n– layer 3 (second semiconductor layer) below a p-n junction between the p layer or guard ring 13 (fifth semiconductor layer of the first conductivity type) and the n– layer 3 (second semiconductor layer).

The thus-fabricated IGBT has an anti-excess voltage protecting function and a drain voltage fixing function, as described in detail below.

When a positive voltage $V_D$ is applied to the drain electrode 1 while maintaining the potential at the source electrode 9 and the gate electrode 10 on the ground level, a depletion region is formed in the n– drain layer 3 because of reverse vias at the p-n junction 2 defined between the p base layer 7 and the n– drain layer 3. This depletion region propagates within the n– drain layer 3 toward the p+ drain layer 4 as the voltage $V_D$ increases. The electrical field in the depletion region also increases with the increase in the source-drain voltage.

When the electrical field reaches a critical value $E_B$ which causes generation of a great number of electron-hole pairs in the depletion region by impact ionization, the thus-generated holes flow through the p base layer 7 to the source electrode 9 while the generated electrons flow toward a p-n junction 5 defined between the p+ drain layer 4 and the n– drain layer 3. This reduces a potential barrier formed by a diffusion potential at this p-n junction, so that holes or a minority carrier from the p+ drain layer 4 are injected into the n– drain layer 3, pass through the depletion region and the p base layer, and flow to the source electrode 9. When passing through the depletion region, the holes are accelerated by the electrical field in the depletion region to obtain a large kinetic energy, thereby further generating new electron-hole pairs due to impact ionization.

With the mechanism as described above, breakdown phenomenon is induced by the p-n-p triple layer structure composed of the p base layer 7, the n– drain layer 3 and the p+ drain layer 4, so that a current abruptly begins to flow between the source electrode 9 and the drain electrode 1 to suppress an increase in the voltage between the source electrode 9 and the drain electrode 1.

Because of the accompanying rapid increase in the drain current, the source-drain voltage is fixed at a particular voltage $V_{BDS}$ or around as hereinbefore described, so that a drain voltage fixing function is provided.

The breakdown operation, which is performed by the p-n-p triple layer structure composed of the p base layer 7, the n– drain layer 3 and the p+ drain layer 4, is qualitatively interpreted by the breakdown operation effected between the emitter and the collector of a pnp bipolar transistor with the base terminal opened.

The breakdown voltage $V_{BDS}$ is expressed by the following formula (1) in terms of the avalanche breakdown voltage $V_{Bpn}$ of a p-n junction defined by the p base layer 7 and the n– drain layer 3 (e.g., the p-type collector and the n-type base in a pnp bipolar transistor) and the current amplification factor $h_{FE}$ of a pnp triple layer bipolar transistor.

$$V_{BDS}=V_{Bpn}/(h_{FE})^{1/n} \qquad (1)$$

where "n" is a constant which depends on the material and structure.

In a p-n– junction in the form of a one-sided step junction, the avalanche breakdown voltage $V_{Bpn}$ of the p-n junction is expressed by the following formula (2) in terms of the specific dielectric constant (permittivity) $K_s$ of the material, the dielectric constant of vacuum $\epsilon_O$, the critical electric field $E_{CRIT}$ at which the avalanche breakdown occurs, the electric charge of electron q, and the impurity concentration $N_{DND}$ of the n– drain layer 3.

$$V_{Bpn}=K_s\times\epsilon_O\times E_{CRIT}^2/(2\times q\times N_{DND}) \qquad (2)$$

Substituting formula (2) into formula (1) yields the following formula (3).

$$V_{BDS}=K_s\times\epsilon_O\times E_{CRIT}^2/(2\times q\times N_{DND}\times(h_{FE})^{1/n}) \qquad (3)$$

This shows that the breakdown voltage $V_{BDS}$ is determined by the impurity concentration $N_{DND}$ and the current amplification constant $h_{FE}$.

The $h_{FE}$ value depends on the layer thickness $t_e$ and impurity concentration $N_{DND}$ of the n– drain layer 3, which corresponds to the base region of a pup triple layer bipolar transistor.

Therefore, the breakdown voltage $V_{BDS}$ of a pnp triple layer structure composed of the p base layer 7, the n– drain layer 3 and the p+ drain layer 4 can be set to a desired value not higher than the source-drain proof voltage determined by the circumferential guard ring structure enclosing the unit cell, by selecting the impurity concentration $N_{DND}$ and layer thickness $t_e$ of the n– drain layer 3.

The present invention has the following advantageous effect. The impurity concentration $N_{DND}$ and layer thickness $t_e$ of the n– drain layer 3 is selected so as to cause breakdown to occur in the unit cell region at a voltage not higher than $V_{GR}$. This makes it possible that the circumferential portion of a unit cell has a higher proof voltage than the core portion of the unit cell to establish a high proof voltage IGBT. It should be also appreciated that breakdown does not occur in the guard ring portion but occurs in the unit cell region, so that the occurrence of breakdown is not limited to near the guard ring portion as was conventionally encountered, and therefore an excess voltage can be absorbed in a broad cell region over the whole chip area. As the result, the current flowing through the chip upon breakdown is made uniform, so that the occurrence of hot spots or other problems are eliminated.

It should be also noted that the source electrode 9 has an extension 9b according to the second phase of the present invention, which provides a by-pass to directly conduct a concentrated current generated in the guard ring area to the source electrode 9 and thereby protects the device from a surge voltage.

EXAMPLE 2

Figure 3:
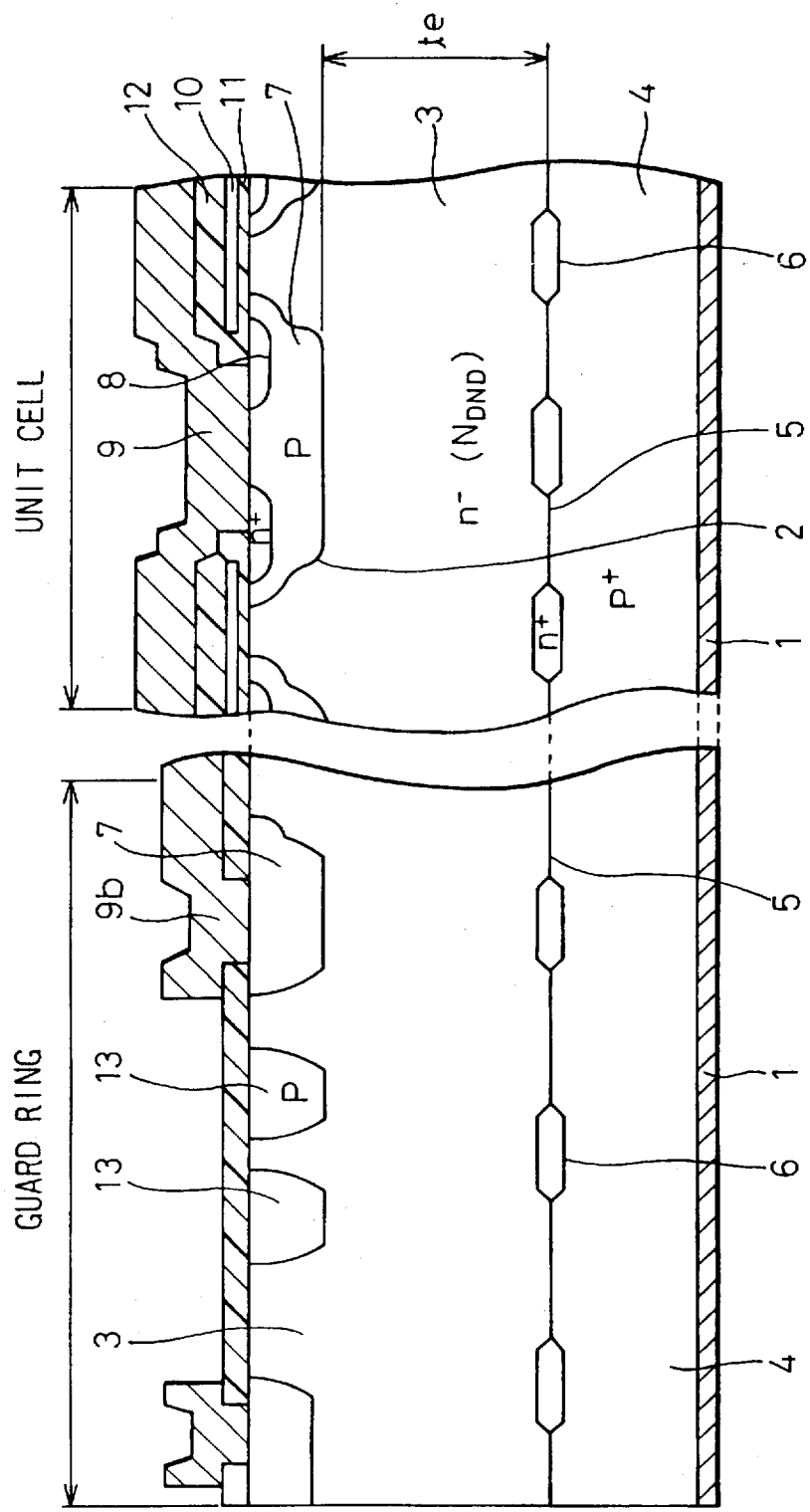
FIG. 3 shows a unit cell portion and a circumferential guard ring portion of an IGBT according to another preferred embodiment of the present invention, in a sectional view.

FIG. 3 shows a unit cell portion and an outer circumferential guard ring portion of an IGBT according to another preferred embodiment of the present invention, in a sectional view. This IGBT has the same structure as that of Example 1, except that an n+ layer 6 (sixth semiconductor layer) in the form of a periodic repeated pattern of stripes is selectively formed near the substrate p-n junction 5. The n+ layer 6 can be formed near the substrate p-n junction 5, either by selective diffusion of an n-type impurity into the surface of the semiconductor substrate or p+ drain layer 4, or by forming an n– layer on the surface of the p+ drain layer 4 followed by selective diffusion of an n-type impurity into the surface of the n– layer, prior to the step of forming the n– drain layer 3 and the subsequent process steps as described in Example 1. In FIG. 3, the corresponding components are denoted by the same reference numerals as those in FIG. 2.

The thus-fabricated IGBT has an anti-excess drain voltage protecting function and a drain voltage fixing function, as described in detail below.

When a positive voltage $V_D$ is applied to the drain electrode 1 while maintaining the potential at the source electrode 9 and the gate electrode 10 on the ground level, a depletion region is formed in the n– drain layer 3 because of reverse vias at the p-n junction 2 defined between the p base layer 7 and the n– drain layer 3. This depletion region propagates within the n– drain layer 3 toward the p+ drain layer 4 as the voltage $V_D$ increases. The electrical field in the depletion region also increases with the increase in the source-drain voltage.

When the electrical field reaches a critical value $E_B$ which causes generation of a great number of electron-hole pairs in the depletion region by impact ionization, the thus-generated holes flow through the p base layer 7 to the source electrode 9 while the generated electrons flow toward a p-n junction 5 defined between the p+ drain layer 4 and the n– drain layer 3. This reduces a potential barrier formed by a diffusion potential at this p-n junction, so that holes or a minority carrier from the p+ drain layer 4 are injected into the n– drain layer 3, pass through the depletion region and the p base layer, and flow to the source electrode 9. When passing through the depletion region, the holes are accelerated by the electrical field in the depletion region to obtain a large kinetic energy, thereby further generating new electron-hole pairs due to impact ionization.

With the mechanism as described above, breakdown phenomenon is induced by the p-n-p triple layer structure composed of the p base layer 7, the n– drain layer 3 and the p+ drain layer 4, so that a current abruptly begins to flow between the source electrode 9 and the drain electrode 1 to suppress an increase in the voltage between the source electrode 9 and the drain electrode 1.

Figure 4:
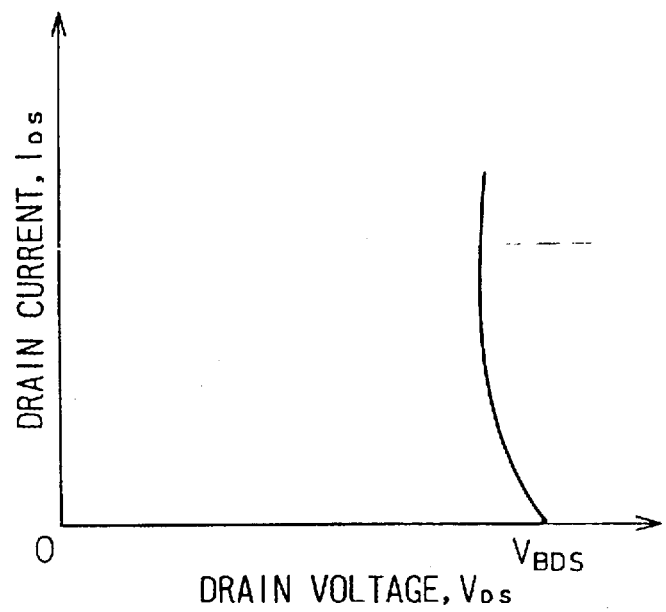
FIG. 4 is a graph showing the electric characteristic of the IGBT shown in FIG. 2.
Figure 5:
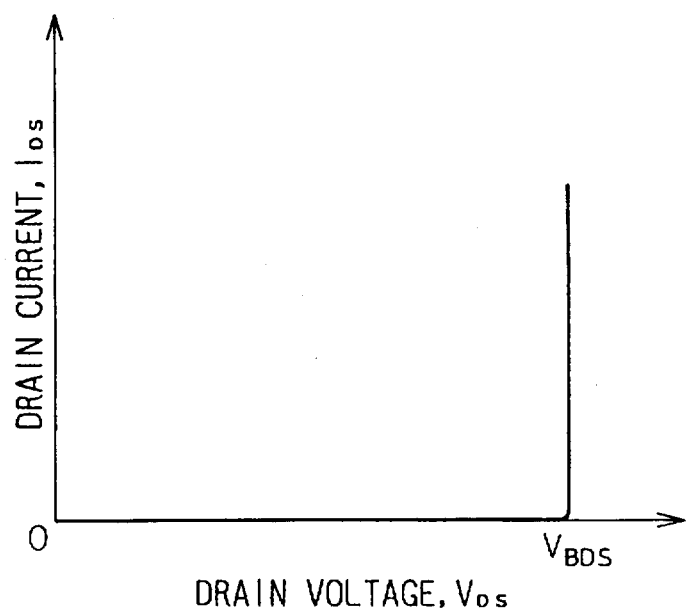
FIG. 5 is a graph showing the electric characteristic of the IGBT shown in FIG. 3.

The breakdown operation is performed by a pnp triple layer bipolar transistor structure composed of the p base layer 7, the n– drain layer 3 and the p+ drain layer 4. Therefore, the drain voltage $V_{BDS}$ is varied by the current amplification constant $h_{FE}$ of the pnp triple layer bipolar transistor structure composed of the p base layer 7, the n– drain layer 3 and the p+ drain layer 4. In a usual bipolar transistor structure, the current amplification constant $h_{FE}$ increases with an increase in the collector current. This also true in the breakdown operation of the pnp triple layer bipolar transistor structure composed of the p base layer 7, the n– drain layer 3 and the p+ drain layer 4. Namely, as the current $I_{DS}$ flowing between the drain electrode 1 and the source electrode 9 is increased, the $h_{FE}$ value of the pnp triple layer bipolar transistor structure composed of the p base layer 7, the n– drain layer 3 and the p+ drain layer 4 is also increased. As a result, the source-drain voltage $V_{DS}$ is reduced with the increase in the source-drain current to exhibit a negative resistance characteristic as shown in FIG. 4, in which the drain voltage $V_{DS}$ is reduced with the increase in the drain current $I_{DS}$.

In contrast, the structure provided with the n+ layer 6 as shown in FIG. 3 has an advantage that the number of holes injected from the p+ drain layer 4 is restricted, so that the $h_{FE}$ value of the pnp triple layer bipolar transistor structure composed of the p base layer 7, the n– drain layer 3 and the p+ drain layer 4 is reduced, thereby reducing the variation of the $h_{FE}$ value in accordance with an increase in the drain current. As a result, the reduction in the $V_{DS}$ is suppressed when the $I_{Ds}$ is increased, and thus, the $V_{DS}$ can be fixed more stably.

It is more advantageous that the n+ layer 6 has a periodic repeated pattern disposed over the p-n junction 5 to provide a uniform density of the current flowing through the IGBT element.

It should be appreciated that, although FIG. 3 shows an example in which the n+ layer 6 is formed at the interface (or p-n junction) 5 between the p+ drain layer 4 and the n– drain layer 3, the equivalent effect can be obtained even when the n+ layer is formed at a position higher or lower than the interface 5. The pattern of the n+ layer 6 is not limited to the stripes but may be patterned in a net, for example.

In the foregoing embodiments, the proof voltage of the guard ring can be made comparable to that of the unit cell by selecting the depth and number of the p layer 13. Alternatively, the proof voltage of the unit cell can be also made smaller than that of the guard ring by selectively providing a continuous n+ layer 6 near the interface 5 between the n– drain layer 3 and the p+ drain layer 4 of the guard ring. This can be interpreted through formula (3) as that the $h_{FE}$ of the pnp bipolar transistor of the guard ring is made smaller than the $h_{FE}$ of the pnp bipolar transistor of the unit cell to make the proof voltage of the unit cell to be higher than the proof voltage of the guard ring.

Although the foregoing embodiments have been described regarding an n channel type IGBT in which the first conductivity type is p-type and the second conductivity type is n-type, the present invention can also be advantageously applied to a p channel type IGBT in which the conductivity types are reversed.

It should be also noted that the source electrode 9 has an extension 9b according to the second phase of the present invention, which provides a by-pass to directly conduct a concentrated current generated in the guard ring area to the source electrode 9 and thereby protects the device from a surge voltage.

In the second phase, according to the first and second aspects of the present invention, when a surge voltage causes a current concentration in the guard ring area, the concentrated current is directly conducted through a by-pass to the source electrode in the cell area to thereby prevent forward-biassing between the well and the source region due to the concentrated current, so that the device has an advantageously improved antibreakdown endurance against an unusually increased electric field intensity in the guard ring area due to the surge voltage.

In the second phase, according to the third aspect of the present invention, the third semiconductor layer in the vicinity of the curved portion of the guard ring area is a dummy layer not containing the fourth semiconductor layer, so that, even when a surge voltage causes a current concentration in the vicinity of the guard ring area, the dummy layer has no pn junctions and does not cause a "latched-up" or interrupted state of the transistor, thereby advantageously providing an improved antibreakdown endurance.

EXAMPLE 3

Figure 7:
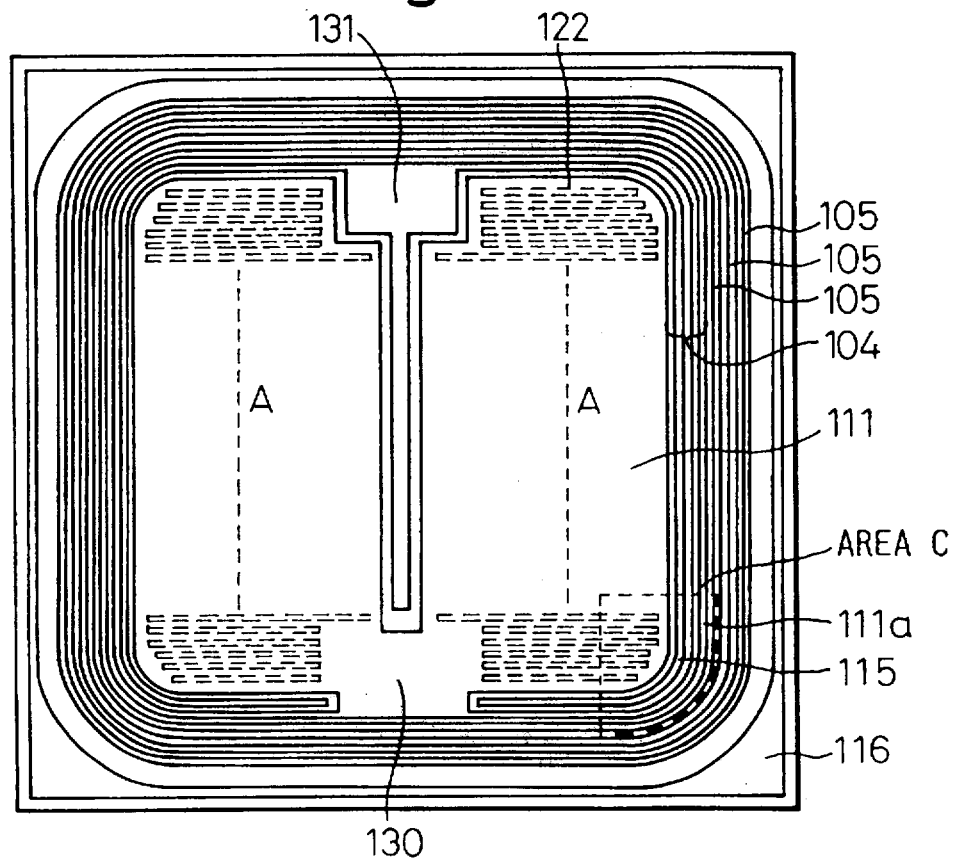
FIG. 7 shows a layout pattern of an entire device chip including the IGBT of FIG. 6, in a plan view.
Figure 8:
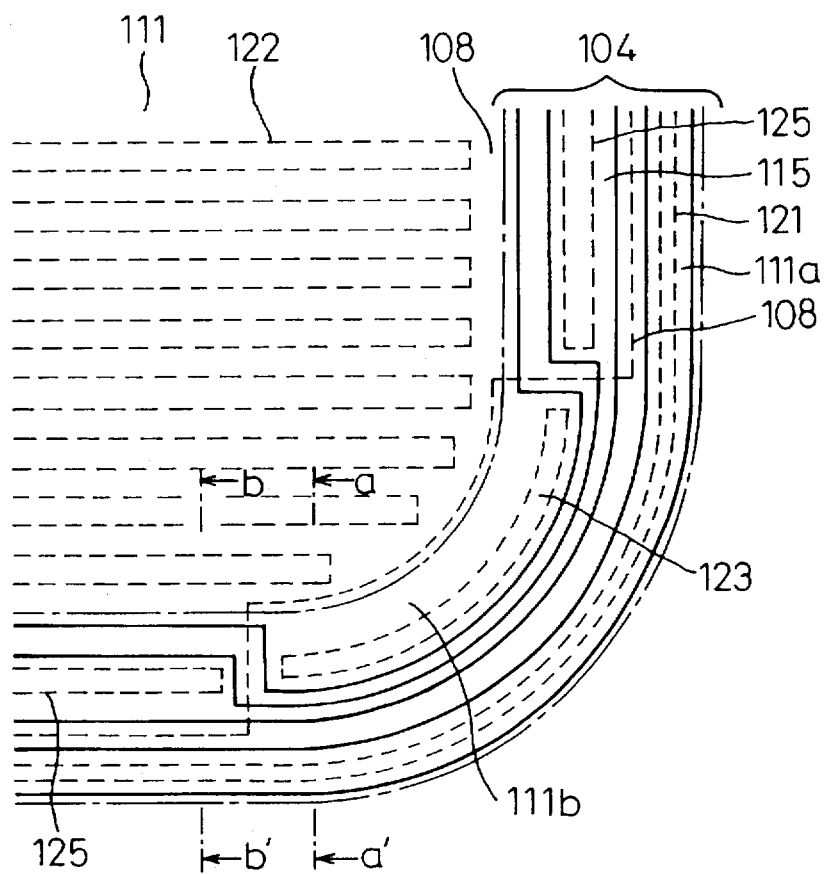
FIG. 8 partially shows a layout pattern of a device chip including an IGBT according to the first embodiment of the present invention, in a plan view.
Figure 9:
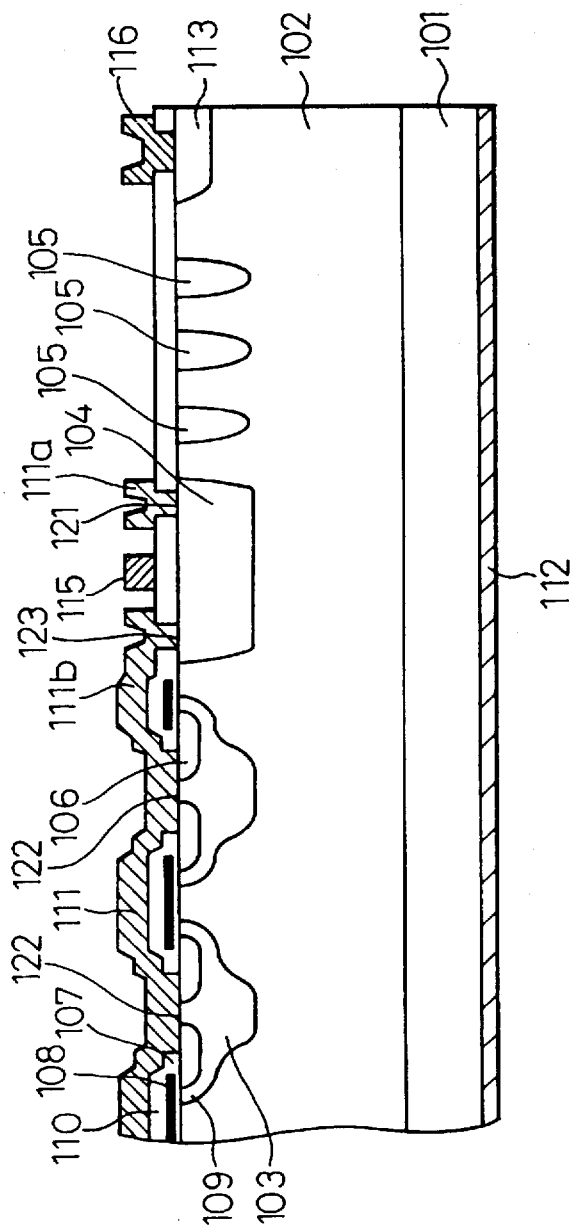
FIG. 9 shows the IGBT of the first embodiment, in a cross-sectional view along line a—a' of FIG. 8.
Figure 10:
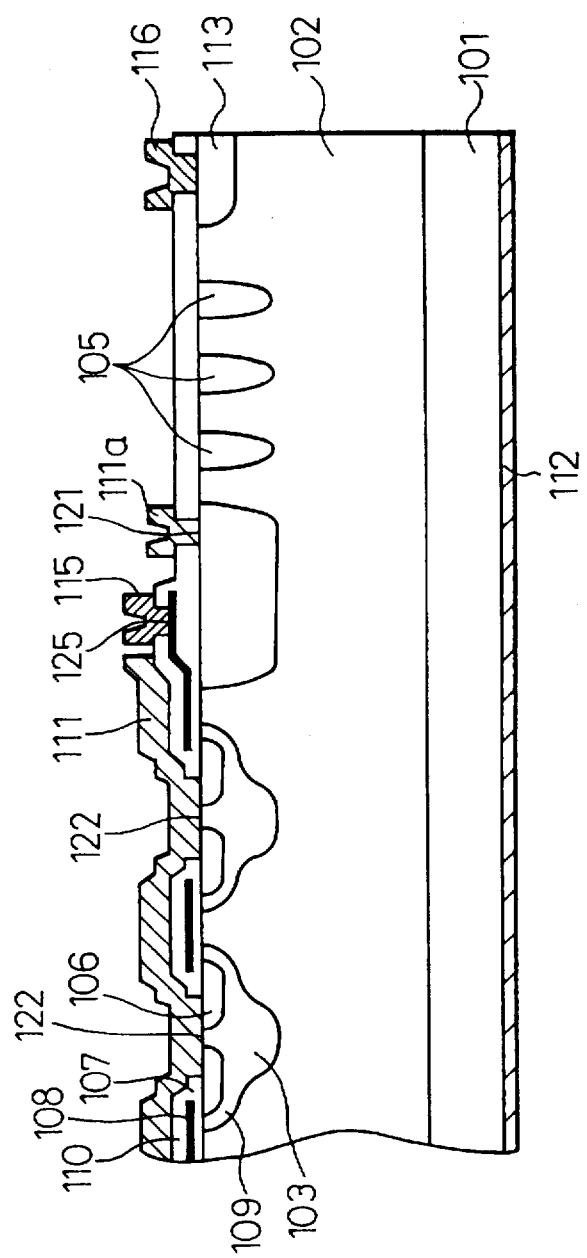
FIG. 10 shows the IGBT of the first embodiment, in another cross-sectional view along line b—b' of FIG. 8.

FIGS. 8 to 10 show the first embodiment of the second phase of the present invention. The shown n-channel IGBT has the same chip layout pattern as shown in FIG. 7, except that the corner area C of FIG. 7 is replaced by a different arrangement shown in FIG. 8. The area C represents four corners of the chip layout pattern which have the same arrangement. FIGS. 9 and 10 show cross sections along lines a—a' and b—b' of FIG. 8, respectively, including the guard ring area. Cross sections will be shown in the same manner in the later Examples. The same symbols denote the corresponding portions of the structure shown in FIG. 6.

Figure 6:
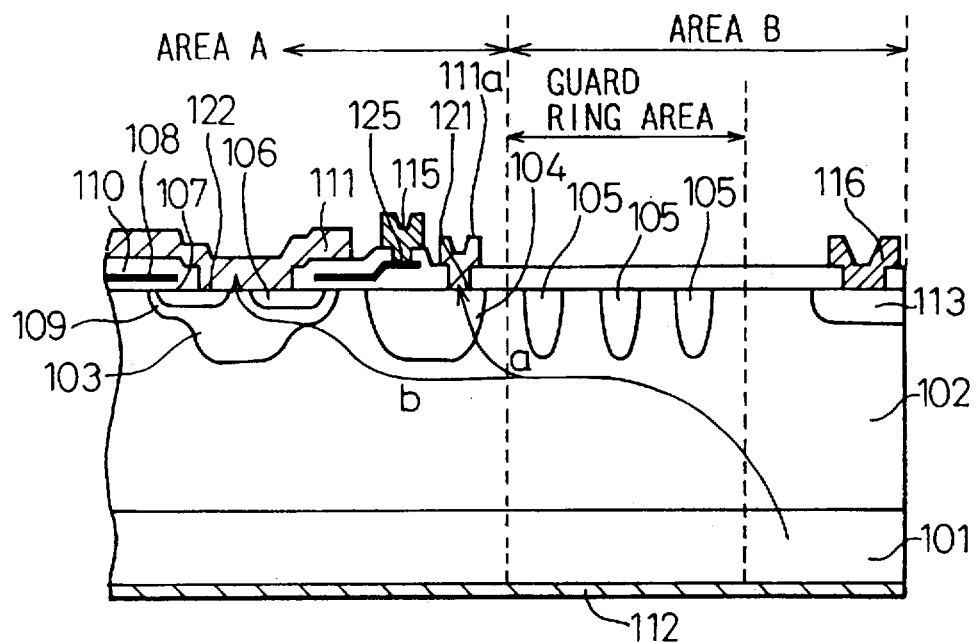
FIG. 6 shows a conventional insulated gate bipolar transistor (IGBT), in a sectional view.

The first embodiment of the present invention is different from the conventional structure shown in FIGS. 6 and 7 in that, in the corner area C, a source electrode 111 has an extension 111b extending outwardly from the cell area and brought into contact with the p region 104 via a contact hole 123 through an interlaminar insulating layer 110, as can be seen from the plan view pattern of FIG. 8 and the cross section of FIG. 9.

In this arrangement, when an applied surge voltage imparts a plus potential to the drain electrode 112 relative to the source electrode 111, an intense electric field is generated in the vicinity of the corner of the guard ring area and carriers are generated by impact ionization. When the thus-generated carriers flows as a current toward the source electrode 111 of the cell area, the extension 111b of the source electrode 111 extracts the flowing carriers or excess current through the p region 104 to reduce the amount of the current flowing into the cell area. Namely, the extension 111b forms a by-pass which directly conducts the generated current to the source electrode 111 and thereby, prevents the occurrence of a forward biassing between the p well 103/109 and the source region 106 and the resulting "latch-up" of the transistor, to consequently provide an improved antibreakdown endurance.

It should be noted that this embodiment has a plan-view arrangement in which the region 111b forms the by-pass in the curved or corner portions whereas the region 115 forms the gate electrode lead line in the linear portions. Both the corner and linear portions have an outermost source electrode lead line 111a.

Typically, the source electrode 111 may include a cell portion 122 (FIG. 7) connected to the source region 106 in the first or p well 103/109 and a pad portion 130 (FIG. 7) connected to an external lead electrode, and the by-pass includes the extension 111b of the cell portion 122 (FIG. 7) of the source electrode 111.

EXAMPLE 4

Figure 11:
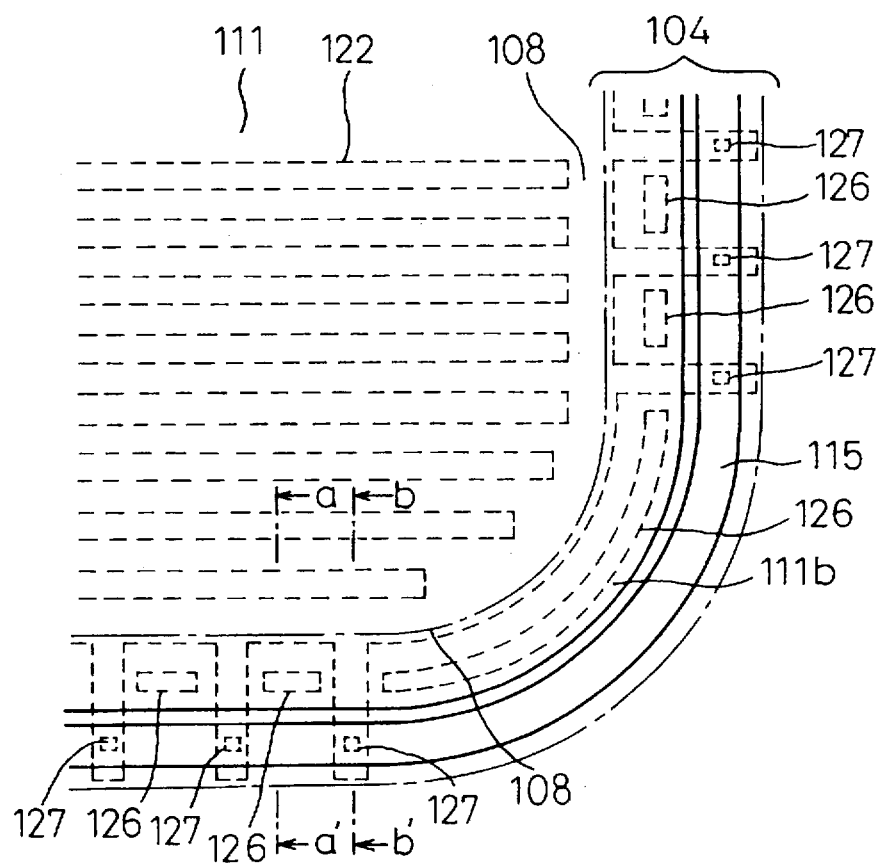
FIG. 11 partially shows a layout pattern of a device chip including an IGBT according to the second embodiment of the present invention, in a plan view.
Figure 12:
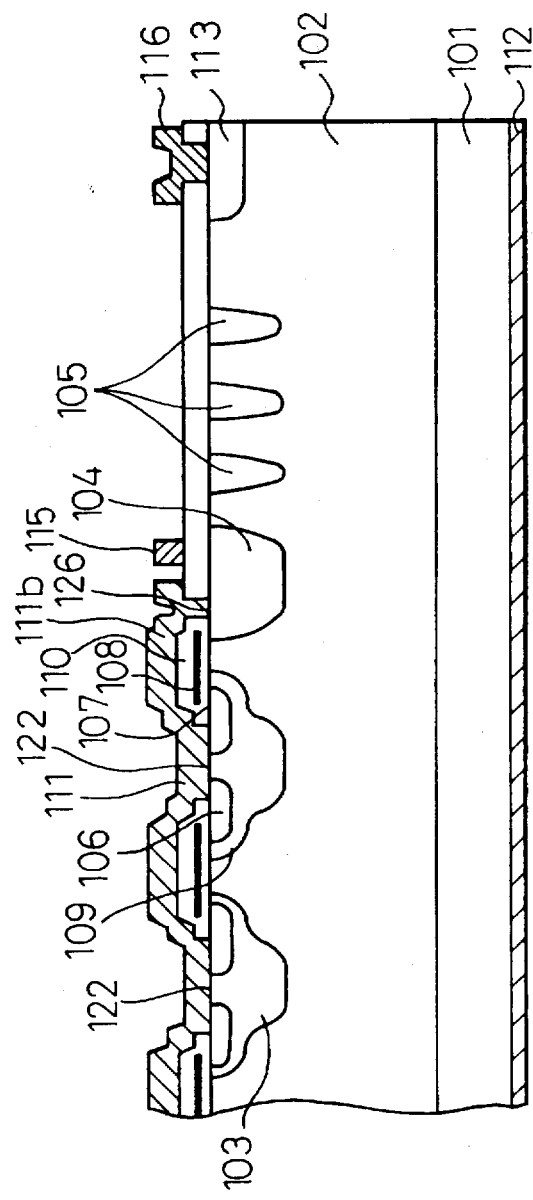
FIG. 12 shows the IGBT of the second embodiment, in a cross-sectional view along line a—a' of FIG. 11.
Figure 13:
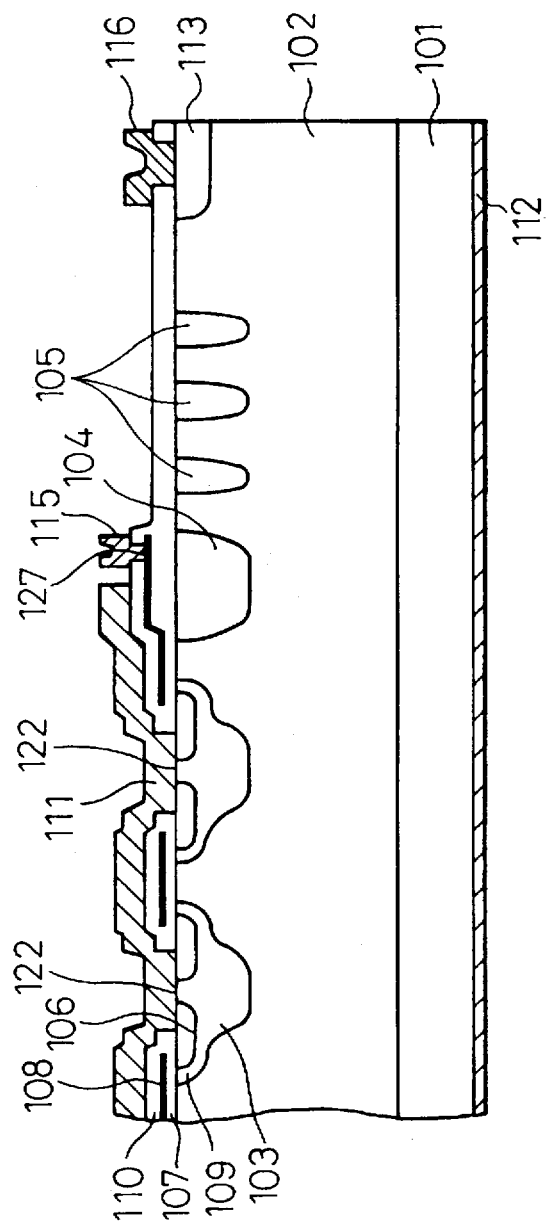
FIG. 13 shows the IGBT of the second embodiment, in another cross-sectional view along line b—b' of FIG. 11.

FIGS. 11 to 13 show the second embodiment of the second phase of the present invention. FIG. 11 shows the corner area C, FIGS. 12 and 13 show cross sections along lines a—a' and b—b' of FIG. 11, respectively.

This second embodiment has the same feature as the first embodiment in that, in the corner area C, a source electrode 111 has an extension 111b extending outwardly from the cell area and brought into contact with the p region 104 via a contact hole 123 through an interlaminar insulating layer 110, as can be seen in FIG. 12.

Moreover, the second embodiment also has an additional feature that a contact region 126 in which the extension 111b of the source electrode 111 is in contact with the p region 104 and a contact region 127 in which an extension of the gate electrode 108 is in contact with the gate lead line 115 are alternately disposed, at least along the linear portion of the guard ring area in the vicinity of the curved portion thereof.

The additional feature of the second embodiment provides an additional advantage that the area for extracting the excess current is increased in the unit area of the device to further decrease the current flowing into the cell area and prevent occurrence of the "latch-up", thereby further improving the antibreakdown endurance.

If the alternate contact region pattern of this embodiment entirely surrounds the periphery of the cell area, the carrier extracting extension 111b, which is in contact with the p region 104 through the contact hole 126, also stabilizes the peripheral potential, so that the source lead line 111a is not necessary and the area of the p region 104 can be reduced. It is also advantageous that, when an inversion layer is formed in the channel, the electron current through the channel is protected from a hole current concentration because holes injected from the p+ layer 101 are also extracted, thereby improving the anti-"latch-up" endurance.

EXAMPLE 5

Figure 14:
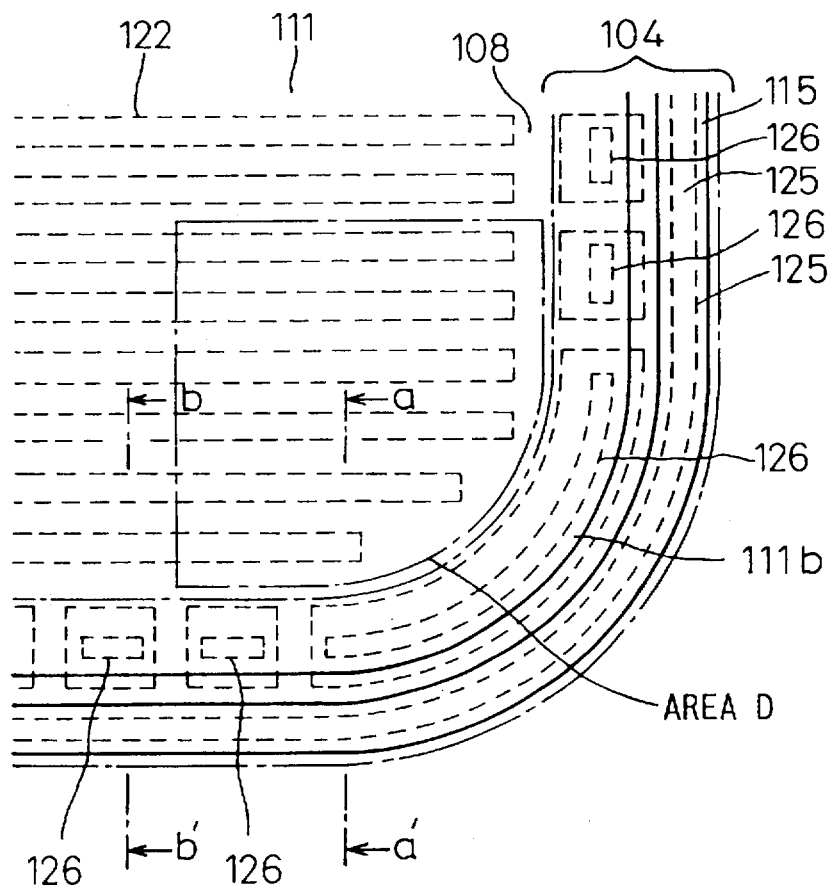
FIG. 14 partially shows a layout pattern of a device chip including an IGBT according to the third embodiment of the present invention, in a plan view.
Figure 15:
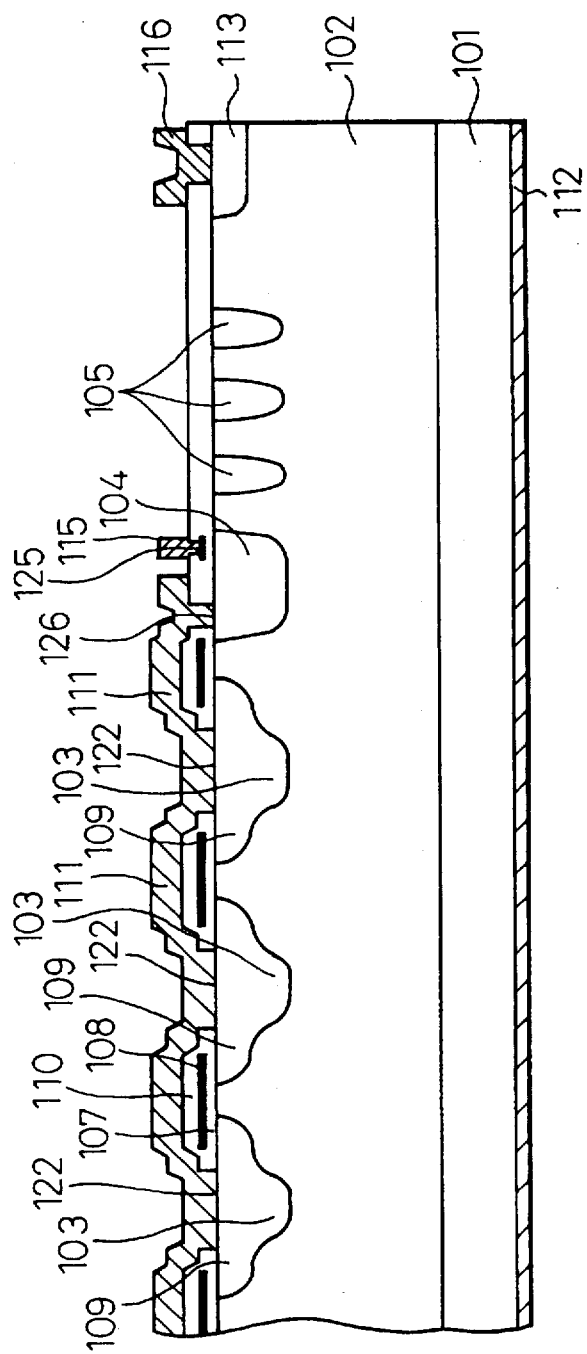
FIG. 15 shows the IGBT of the third embodiment, in a cross-sectional view along line a—a' of FIG. 14.
Figure 16:
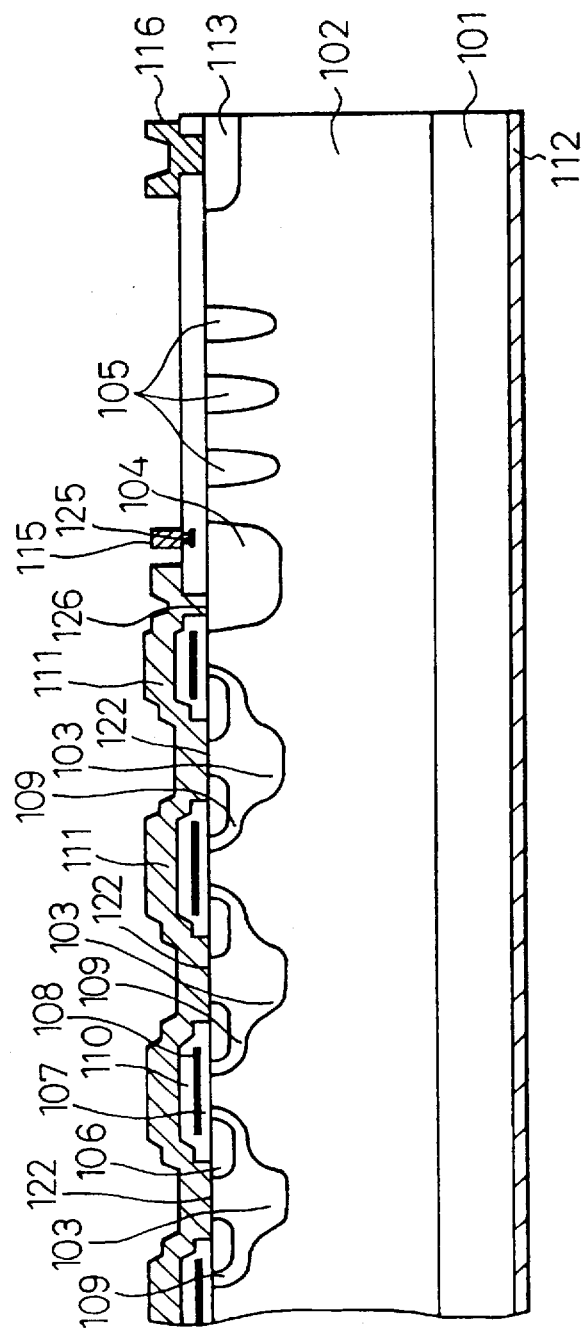
FIG. 16 shows the IGBT of the third embodiment, in another cross-sectional view along line b—b' of FIG. 14.

FIGS. 14 to 16 show the third embodiment of the second phase of the present invention. FIG. 14 shows the corner area C, and FIGS. 15 and 16 show cross sections along lines a—a' and b—b' of FIG. 14, respectively.

The third embodiment has a feature that, in the area D defined by a double-dotted line shown in FIG. 14, in the cell area in the vicinity of the curved portion of the guard ring area shown in FIG. 15, the n+ source region 106 is not formed in the p well 103/109 so that the p well 103/109 is a dummy layer in the limited area D.

This feature of the third embodiment has an advantage that, even when a surge voltage generates an intense electric field in the vicinity of the curved portion of the guard ring and a current of carriers generated by impact ionization flows toward the source electrode 111, the absence of the n+ region 106 ensures the absence of a parasitic transistor structure, so that the antibreakdown endurance is improved by the absence of a parasitic transistor operation.

Namely, according to the third embodiment, the corner area C contains no channel regions and therefore, accepts no injection of an electron current, so that the injected hole amount is also reduced and the area for extracting the excess current is increased, which both synergistically improve the anti-"latch-up" endurance.

The p regions 103/109 of the area D have the same shape and pitch as those of the cell area, so that application of a drain voltage can produce the same propagation manner of the depletion layer, i.e., the same electric field distribution, in both the area D and the cell area to establish uniform potential distribution over the entire chip area. This ensures a uniform junction current without current concentration even under a surge voltage occurring at a large dv/dt value. The p regions 103/109 may be separately formed in the area D and in the cell area.

EXAMPLE 6

Figure 17:
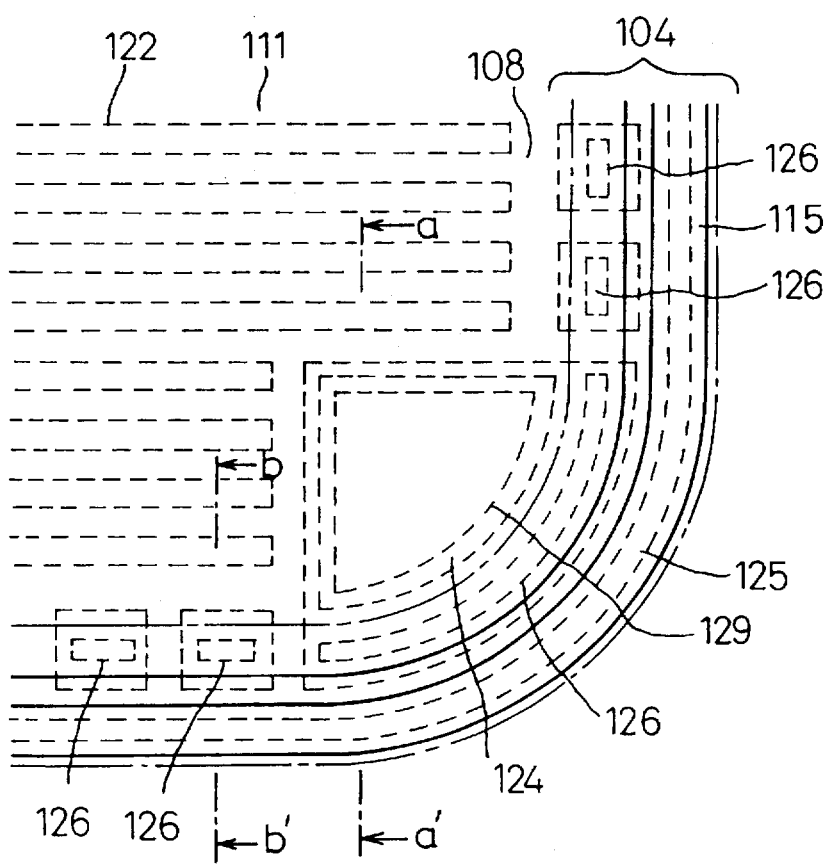
FIG. 17 partially shows a layout pattern of a device chip including an IGBT according to the fourth embodiment of the present invention, in a plan view.
Figure 18:
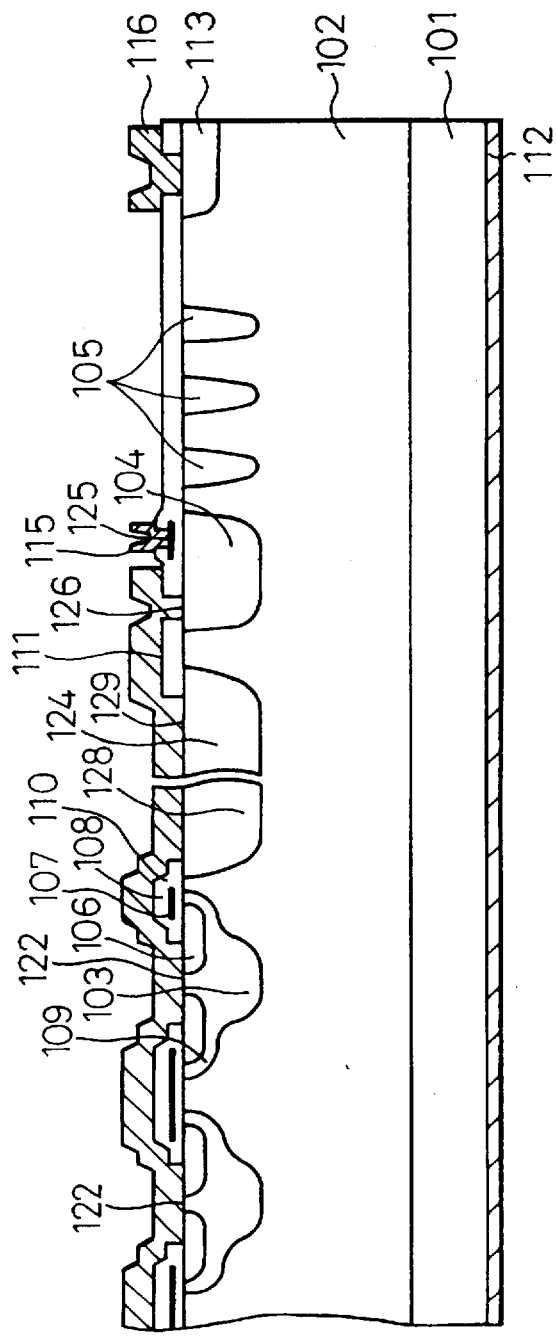
FIG. 18 shows the IGBT of the fourth embodiment, in a cross-sectional view along line a—a' of FIG. 17.
Figure 19:
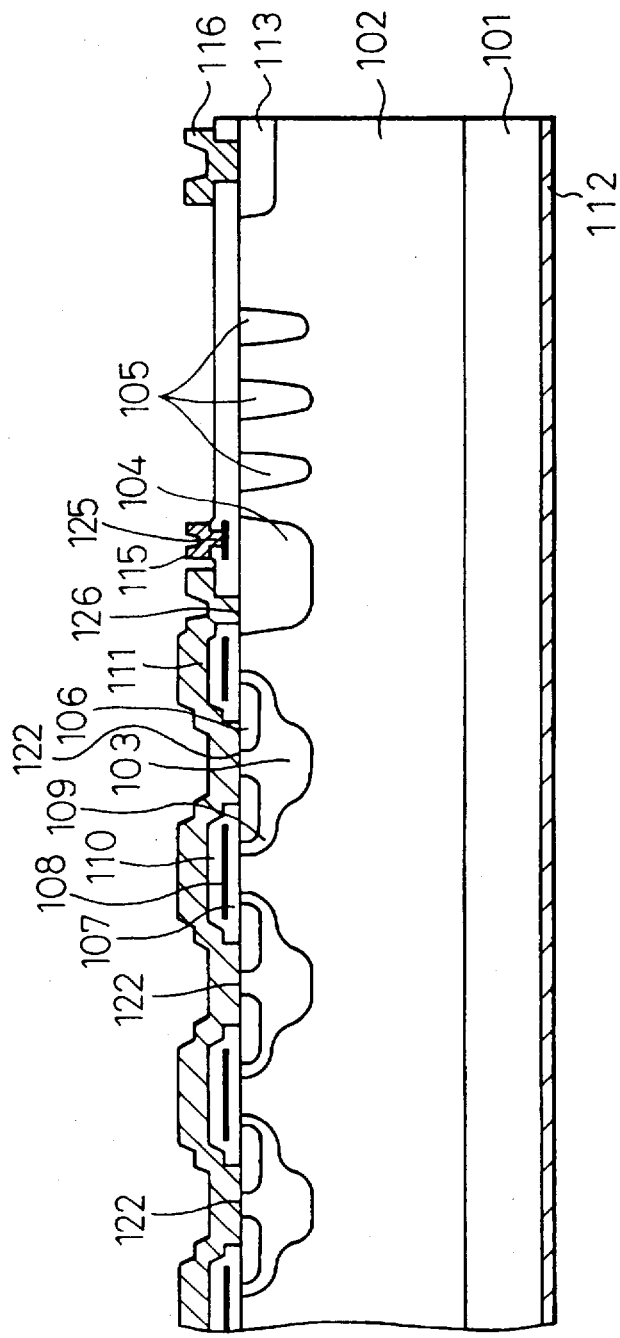
FIG. 19 shows the IGBT of the fourth embodiment, in another cross-sectional view along line b—b' of FIG. 17.

FIGS. 17 to 19 show the fourth embodiment of the second phase of the present invention. FIG. 17 shows the corner area C and FIGS. 18 and 19 show cross sections along lines a—a' and b—b' of FIG. 17, respectively.

The fourth embodiment has a feature that a p region 124 is provided between the cell area and the p region 104 and the extension of the source electrode 111 is in contact with the p region 124 via a contact hole 129 through an insulating layer.

This feature provides an advantage that, when a surge voltage generates an intense electric field in the vicinity of the curved portion of the guard ring and a current of carriers generated by impact ionization flows toward the source electrode 111, the p region 124 extracts carriers through the contact hole 129, thereby prevents the occurrence of current concentration to the cell area in the corner area C, suppresses activation of a parasitic transistor in the cell area, and improves the antibreakdown endurance.

Namely, according to the fourth embodiment, an enlarged area of contact with the p regions provides an advantage that, when an inversion layer is formed in the channel, the electron current through the channel is protected from a hole current concentration to the cell area near the corner area C, because holes injected from the p+ layer 101 are extracted to prevent the current concentration.

If the extracting region has a fan or sector shape, when a current of holes from the curved portion of the guard ring area of the corner area C flows toward the cell area, the hole current can be more efficiently extracted. The p region 124 and the contact hole 129 may have an increased dimension either in the X or Y coordinate directions on the plan view. The p regions 124 and 104 may be unified and the contact holes 126 and 129 may also be unified.

Although Examples 3 through 6 described a stripe cell pattern, it can be readily recognized that a cell pattern in the form of a quadrangle, hexagon, octagon, or other polygons will provide the same advantages as described above according to the present invention.

Two or more of the above-described embodiments may be combined to provide a further improved antibreakdown endurance. For example, the third and fourth embodiments include the feature of the second embodiment and can be recognized as a modification of the second embodiment.

The curved portion of the guard ring area may not be an entirely smooth curve but may contain one or more angular edges.

It should also be appreciated that, although Examples 3 to 6 describe an n-channel IGBT, the present invention may also be evenly applied to a p-channel IGBT.

Example 3 may be also applied to a MOSFET having a first semiconductor layer made of an n+ layer.

We claim:

1. An insulated gate field effect transistor comprising:

a semiconductor substrate having a cell area formed on a first side of said semiconductor substrate, said cell area comprising a plurality of first wells of a first conductivity type, each of said plurality of first wells containing:

a source region of a second conductivity type, a channel region in a surface portion of said semiconductor substrate adjacent to said source region, a gate electrode formed over said channel region with a gate insulating film therebetween, a source electrode formed on said respective well region and being in common electrical contact with respective source regions of the others of said plurality of first wells;

a drain electrode provided on a second side of said semiconductor substrate; and a guard ring area disposed on said first side of said semiconductor substrate so as to surround said cell area;

said source electrode having an extension which extends from said source electrode and forms a by-pass which is connected directly to a second well of said first conductivity type formed in said first side of said semiconductor substrate between said cell area and said guard ring area whereby, when a current concentration occurs within said guard ring area, said concentrated current is conducted directly to said source electrode in said cell area through said by-pass, thereby preventing said concentrated current from causing a forward biassing between said plurality of first wells and said source region.

2. An insulated gate field effect transistor according to claim 1, wherein said source electrode comprises:

a cell connection portion connected to said source region in said respective first well, said by-pass including said cell connection portion; and a pad connection portion connected to an external lead electrode.

3. An insulated gate field effect transistor comprising:

a first semiconductor layer;

a second semiconductor layer of a first conductivity type in contact with, said first semiconductor layer;

a plurality of third semiconductor layers of a second conductivity type forming a cell area in said second semiconductor layer, respective junctions between said second semiconductor layer and said plurality of third semiconductor layers terminating at a surface of said second semiconductor layer;

a plurality of fourth semiconductor layers of said first conductivity type formed in each of said plurality of third semiconductor layers, respective junctions between said plurality of third semiconductor layers and respective ones of said plurality of fourth semiconductor layers terminating at respective surfaces of said third semiconductor layer;

a gate electrode formed over a channel region with a gate insulating film therebetween, said channel region being provided by respective surfaces of said plurality of third semiconductor layers in a portion between said second semiconductor layer and said respective ones of said plurality of fourth semiconductor layers, and said gate electrode being commonly connected to said plurality of third semiconductor layers;

a source electrode in contact with both respective ones of said plurality of third semiconductor layers and respective ones of said plurality of fourth semiconductor layers;

a drain electrode for supplying a drain current through said first semiconductor layer;

a guard ring area formed between said cell area and a periphery of said second semiconductor layer to provide a band pattern surrounding said cell area; and a fifth semiconductor layer of said second conductivity type formed between said cell area and said guard ring area;

said source electrode having an extension which extends from said source electrode and forms a by-pass which is connected directly to a second well, whereby, when a current concentration occurs within said guard ring area, said concentrated current is conducted directly to said source electrode in said cell area through said by-pass, thereby preventing said concentrated current from causing a forward biassing between said plurality of third semiconductor layers and said plurality of fourth semiconductor layers.

4. An insulated gate field effect transistor according to claim 3, wherein said source electrode comprises:

a cell connection portion connected to said source region in said third semiconductor layer, said by-pass including said cell connection portion; and a pad connection portion connected to an external lead electrode.

5. An insulated gate field effect transistor comprising:

a first semiconductor layer;

a second semiconductor layer of a first conductivity type in contact with said first semiconductor layer;

a plurality of third semiconductor layers of a second conductivity type forming a cell area in said second semiconductor layer, respective junctions between said second semiconductor layer and said plurality of third semiconductor layers terminating at a surface of said second semiconductor layer;

a plurality of fourth semiconductor layers of said first conductivity type formed in each of said plurality of third semiconductor layers, respective junctions between said plurality of third semiconductor layers and respective ones of said plurality of fourth semiconductor layers terminating at respective surfaces of said third semiconductor layer;

a gate electrode formed over a channel region with a gate insulating film therebetween, said channel region being provided by respective surfaces of said plurality of third semiconductor layers in a portion between said second semiconductor layer and said respective ones of said plurality of fourth semiconductor layers, and said gate electrode being commonly connected to said plurality of third semiconductor layers;

a source electrode in contact with both respective ones of said plurality of third semiconductor layers and respective ones of said plurality of fourth semiconductor layers;

a drain electrode for supplying a drain current through said first semiconductor layer;

a guard ring area formed between said cell area and a periphery of said second semiconductor layer to provide a band pattern surrounding said cell area; and a fifth semiconductor layer formed in a surface of said second semiconductor layer in a portion between said cell area and a curved portion of said guard ring area;

said source electrode having an extension which extends from said source electrode, lies outside said cell area, and is connected directly to said fifth semiconductor layer.

6. An insulated gate field effect transistor according to claim 5, wherein;

said cell area comprises cells in a form of one of a stripe and a polygon.

7. An insulated gate field effect transistor according to claim 5, wherein;

said curved portion of said guard ring area comprises one of a smooth curve and one or more angular edges.

8. An insulated gate field effect transistor according to claim 5, further comprising:

a gate electrode lead line formed on said fifth semiconductor layer; and a source electrode lead line formed on said fifth semiconductor layer;

said fifth semiconductor layer being formed outside and surrounding said cell area.

9. An insulated gate field effect transistor according to claim 5, further comprising:

a source electrode lead line formed on said fifth semiconductor layers said fifth semiconductor layer being formed outside and surrounding said cell area.

10. An insulated gate field effect transistor according to claim 5, further comprising:

a gate electrode lead line formed on said fifth semiconductor layer;

said fifth semiconductor layer being formed outside and surrounding said cell area.

11. An insulated gate field effect transistor according to claim 8 or 10, wherein:

a contact between said gate electrode of said cell area and said gate electrode lead line and a contact between said extension of said source electrode and said fifth semiconductor layer are alternately disposed in a vicinity of said curved portion of said guard ring area.

12. An insulated gate field effect transistor according to claim 8 or 10, wherein:

a contact between said gate electrode of said cell area and said gate electrode lead line and a contact between said extension of said source electrode and said fifth semiconductor layer are alternately disposed along an entire periphery of said cell area.

13. An insulated gate field effect transistor according to any one of claims 5 to 10, further comprising:

a sixth semiconductor layer of said second conductivity type connected to said source electrode of said cell area inside said curved portion of said guard ring between said fifth semiconductor layer and said cell area.

14. An insulated gate field effect transistor comprising:

a first semiconductor layer;

a second semiconductor layer of a first conductivity type in contact with said first semiconductor layer;

a plurality of third semiconductor layers of a second conductivity type forming a cell area in said second semiconductor layer, respective junctions between said second semiconductor layer and said plurality of third semiconductor layers terminating at a surface of said second semiconductor layer;

a plurality of fourth semiconductor layers of said first conductivity type formed in each of said plurality of third semiconductor layers, respective junctions between said plurality of third semiconductor layers and respective ones of said plurality of fourth semiconductor layers terminating at respective surfaces of said third semiconductor layer;

a gate electrode formed over a channel region with a gate insulating film therebetween, said channel region being provided by respective surfaces of said plurality of third semiconductor layers in a portion between said second semiconductor layer and said respective ones of said plurality of fourth semiconductor layers, and said gate electrode being commonly connected to said plurality of third semiconductor layers;

a source electrode in contact with both respective ones of said plurality of third semiconductor layers and respective ones of said plurality of fourth semiconductor layers;

a drain electrode for supplying a drain current through said first semiconductor layer;

a guard ring area formed between said cell area and a periphery of said second semiconductor layer to provide a band pattern surrounding said cell area; and a dummy layer comprising portions of said plurality of third semiconductor layers in which said fourth semiconductor layer is not formed, is formed in a vicinity of a curved portion of said guard ring area;

said source electrode having an extension which extends from said source electrode and which is connected directly to said guard ring area.

15. An insulated gate field effect transistor according to any one of claim 1, 3, 5 or 14, further comprising:

a diffused region of said first conductivity type formed in said guard ring area, said diffused region not contacting any electrode.

16. An insulated gate field effect transistor comprising:

a semiconductor substrate having a cell area formed on a first side of said semiconductor substrate, said cell area comprising a plurality of first wells of a first conductivity type, each of said plurality of first wells containing:

a source region of a second conductivity type, a channel region in a surface portion of said semiconductor substrate adjacent to said source region, a gate electrode formed over said channel region with a gate insulating film therebetween, a source electrode formed on said respective well region and being in common electrical contact with respective source regions of the others of said plurality of first wells;

a drain electrode provided on a second side of said semiconductor substrate; and a peripheral portion disposed on said first side of said semiconductor substrate so as to surround said cell area;

said source electrode having an extension which extends from said source electrode and forms a by-pass which is connected directly to a second well of said first conductivity type formed in said first side of said semiconductor substrate between said cell area and said peripheral portion whereby, when a current concentration occurs within said peripheral portion, said concentrated current is conducted directly to said source electrode in said cell area through said by-pass, thereby preventing said concentrated current from causing a forward biassing between said plurality of first wells and said source region.

17. An insulated gate field effect transistor comprising:

a plurality of transistor cell structures;

gate wiring connected to the cell structures, for facilitating application of a common gate signal to the plurality of transistor cell structures;

a cell-surrounding region surrounding the plurality of transistor cell structures, said gate wiring having elongated extensions which extend to the cell-surrounding region;

a semiconductive layer in the cell-surrounding region, said semiconductive layer being arranged so as to surround the plurality of transistor cell structures;

a gate metal line disposed on the semiconductive layer and connected to the elongated extensions of the gate wiring;

a source metal electrode connected to the plurality of transistor cell structures and also connected, at corner portions of the cell-surrounding region, to the semiconductive layer at a deeper position with respect to the gate metal line, wherein said elongated extensions are present only at non-corner portions of the cell-surrounding region.

18. The insulated gate field effect transistor of claim 17, and further comprising a source branch lane which branches from said source metal electrode and contacts an outer portion of the semiconductive layer with respect to the gate metal line.

19. The insulating gate field effect transistor of claim 17, and further comprising at least one guard ring disposed outside of said semiconductive layer.

* * * * *